United States Patent
Durney et al.

(10) Patent No.: US 7,350,390 B2
(45) Date of Patent: Apr. 1, 2008

(54) SHEET MATERIAL WITH BEND CONTROLLING DISPLACEMENTS AND METHOD FOR FORMING THE SAME

(75) Inventors: Max W. Durney, San Francisco, CA (US); Arvind Rangarajan, San Francisco, CA (US)

(73) Assignee: Industrial Origami, Inc., San Francisco, CA (US)

( * ) Notice: Subject to any disclaimer, the term of this patent is extended or adjusted under 35 U.S.C. 154(b) by 100 days.

(21) Appl. No.: 11/080,288

(22) Filed: Mar. 14, 2005

(65) Prior Publication Data
US 2005/0257589 A1 Nov. 24, 2005

Related U.S. Application Data

(63) Continuation-in-part of application No. 10/795,077, filed on Mar. 3, 2004, now Pat. No. 7,152,450, which is a continuation-in-part of application No. 10/672,766, filed on Sep. 26, 2003, now Pat. No. 7,152,449, which is a continuation-in-part of application No. 10/256,870, filed on Sep. 26, 2002, now Pat. No. 6,877,349, which is a continuation-in-part of application No. 09/640,267, filed on Aug. 17, 2000, now Pat. No. 6,481,259.

(51) Int. Cl.
*B21D 28/00* (2006.01)
(52) U.S. Cl. .................... 72/325; 72/379.2; 428/136
(58) Field of Classification Search ............... 72/326, 72/325, 379.2; 428/136
See application file for complete search history.

(56) References Cited

U.S. PATENT DOCUMENTS

| | | | |
|---|---|---|---|
| 975,121 A | 11/1910 | Carter |
| 1,295,769 A | 2/1919 | Kux |

(Continued)

FOREIGN PATENT DOCUMENTS

DE 298 18 909 U1 2/1999

(Continued)

OTHER PUBLICATIONS

Derwent Abstract Accession No. 80-C6243C/12, FR 2428372 A, Feb. 8, 1980 (Merlin & Gerin).

(Continued)

*Primary Examiner*—Daniel C Crane
(74) *Attorney, Agent, or Firm*—Morgan, Lewis & Bockius LLP; David J. Brezner; Victor E. Johnson

(57) ABSTRACT

A method of preparing a sheet of material for bending along a bend line includes the step of forming at least one displacement in the thickness direction of the sheet of material, the displacement including a flat zone substantially parallel to the sheet of material with a portion of the periphery of the flat zone extending along and adjacent to the bend line, and including an angled transition zone interconnecting the flat zone with a remainder of the sheet of material. The forming step is preferably accomplished using one of a stamping process, a punching process, a roll-forming process and an embossing process. A sheet of material suitable for bending using the process also is disclosed, as are the use of coatings, shin guards and displacing the area of the sheet between bending inducing slits.

33 Claims, 19 Drawing Sheets

U.S. PATENT DOCUMENTS

| | | | |
|---|---|---|---|
| 1,405,042 A | 1/1922 | Kraft | |
| 1,698,891 A | 1/1929 | Overbury | |
| 2,127,618 A | 8/1938 | Riemenschneider | |
| 2,515,067 A * | 7/1950 | Wright et al. | 248/264 |
| 2,560,786 A | 7/1951 | Wright et al. | |
| 3,258,380 A | 6/1966 | Fischer et al. | |
| 3,341,395 A | 9/1967 | Weber | |
| 3,353,639 A | 11/1967 | Andriussi | |
| 3,756,499 A | 9/1973 | Giebel et al. | |
| 3,788,934 A | 1/1974 | Coppa | |
| 3,854,859 A | 12/1974 | Sola | |
| 3,907,193 A | 9/1975 | Heller | |
| 3,938,657 A | 2/1976 | David | |
| 3,963,170 A | 6/1976 | Wood | |
| 4,215,194 A | 7/1980 | Sheperd | |
| 4,289,290 A | 9/1981 | Miller | |
| 4,559,259 A | 12/1985 | Cetrelli | |
| 4,628,661 A | 12/1986 | St. Louis | |
| 4,837,066 A | 6/1989 | Quinn et al. | |
| 5,148,900 A | 9/1992 | Mohan | |
| 5,157,852 A | 10/1992 | Patrou et al. | |
| 5,225,799 A | 7/1993 | West et al. | |
| 5,239,741 A | 8/1993 | Shamos | |
| 5,390,782 A | 2/1995 | Sinn | |
| 5,524,396 A | 6/1996 | Lalvani | |
| 5,568,680 A | 10/1996 | Parker | |
| 5,692,672 A | 12/1997 | Hunt | |
| 5,701,780 A | 12/1997 | Ver Meer | |
| 5,709,913 A | 1/1998 | Anderson et al. | |
| 5,789,050 A | 8/1998 | Kang | |
| 5,885,676 A | 3/1999 | Lobo et al. | |
| 6,132,349 A | 10/2000 | Yokoyama | |
| 6,210,037 B1 | 4/2001 | Brandon, Jr. | |
| 6,412,325 B1 | 7/2002 | Croswell | |
| 6,481,259 B1 | 11/2002 | Durney | |
| 6,599,601 B2 | 7/2003 | Fogle et al. | |
| 6,640,605 B2 | 11/2003 | Gitlin et al. | |
| 6,643,561 B1 | 11/2003 | Torvinen | |
| 6,658,316 B1 | 12/2003 | Mehta et al. | |
| 6,877,349 B2 | 4/2005 | Durney et al. | |
| 2001/0010167 A1 | 8/2001 | Leek | |
| 2002/0184936 A1 | 12/2002 | Gitlin et al. | |
| 2003/0037588 A1 | 2/2003 | Durney et al. | |
| 2004/0035175 A1 | 2/2004 | Karhumaki | |
| 2004/0134250 A1 | 7/2004 | Durney et al. | |
| 2004/0206152 A1 | 10/2004 | Durney et al. | |
| 2005/0005670 A1 | 1/2005 | Durney et al. | |
| 2005/0061049 A1 | 3/2005 | Durney et al. | |
| 2005/0064138 A1 | 3/2005 | Durney et al. | |
| 2005/0097937 A1 | 5/2005 | Durney et al. | |
| 2005/0126110 A1 | 6/2005 | Durney et al. | |

FOREIGN PATENT DOCUMENTS

| | | |
|---|---|---|
| GB | 2 129 339 A | 5/1984 |
| JP | 52-068848 | 6/1977 |
| JP | 53-070069 | 6/1978 |
| JP | 55-022468 | 2/1980 |
| JP | 55-055222 | 4/1980 |
| JP | 59-006116 | 1/1984 |
| JP | 02-065416 U | 5/1990 |
| JP | 02-165817 | 6/1990 |
| JP | 02-192821 | 7/1990 |
| JP | 02-258116 | 10/1990 |
| JP | 04-033723 | 2/1992 |
| JP | 04-091822 | 3/1992 |
| JP | 05-261442 | 10/1993 |
| JP | 07-148528 | 6/1995 |
| JP | 08-224619 | 9/1996 |
| JP | 10-085837 | 4/1998 |
| JP | 11-123468 | 5/1999 |
| JP | 11-188426 | 7/1999 |
| WO | WO 97/24221 A1 | 7/1997 |
| WO | WO 02/13991 A1 | 2/2002 |
| WO | WO 2004/028937 A | 4/2004 |
| WO | WO 2005/082112 A | 9/2005 |
| WO | WO 2005/099925 A | 10/2005 |

OTHER PUBLICATIONS

Derwent Abstract Accession No. 83-G2401K/19, FR 2514103 A, Apr. 8, 1983 (Grun).

Derwent Abstract Accession No. 1995-280162/37, M21, JP 3474242, Dec. 8, 2003 (Amada Co Ltd).

Derwent Abstract Accession No. 97-345802/32, P52, JP 9 141333 A, Jun. 3, 1997 (Kokusai Denki KK).

Derwent Abstract Accession No. 98-265616/24, P52, JP 10-085837 A, Apr. 7, 1998 (Mitsubishi Electric Corp).

Derwent Abstract Accession No. 99-062297/06, P52, DE 29818909 U, Dec. 24, 1998 (Fortmeier).

Derwent Abstract Accession No. 1999-340844/29, P52, JP 11-123458 A, May 11, 1999 (Meij Nat Kogyo KK).

*EasyBend™—Complex Bending Made Easy*, © 2004 Mate Precision Tooling Inc., Anoka, Minnesota.

Patent Abstracts of Japan, vol. 004, No. 053 (M-008), Apr. 19, 1980 (JP 55-022468 A).

Patent Abstracts of Japan, vol. 015, No. 006 (M-1066), Jan. 8, 1991 (JP 02-258116 A).

Publication "Office dA" by Contemporary World Architects, 2000, pp. 15, 20-35, Rockport Publishers, Inc., Gloucester, Massachusetts.

* cited by examiner

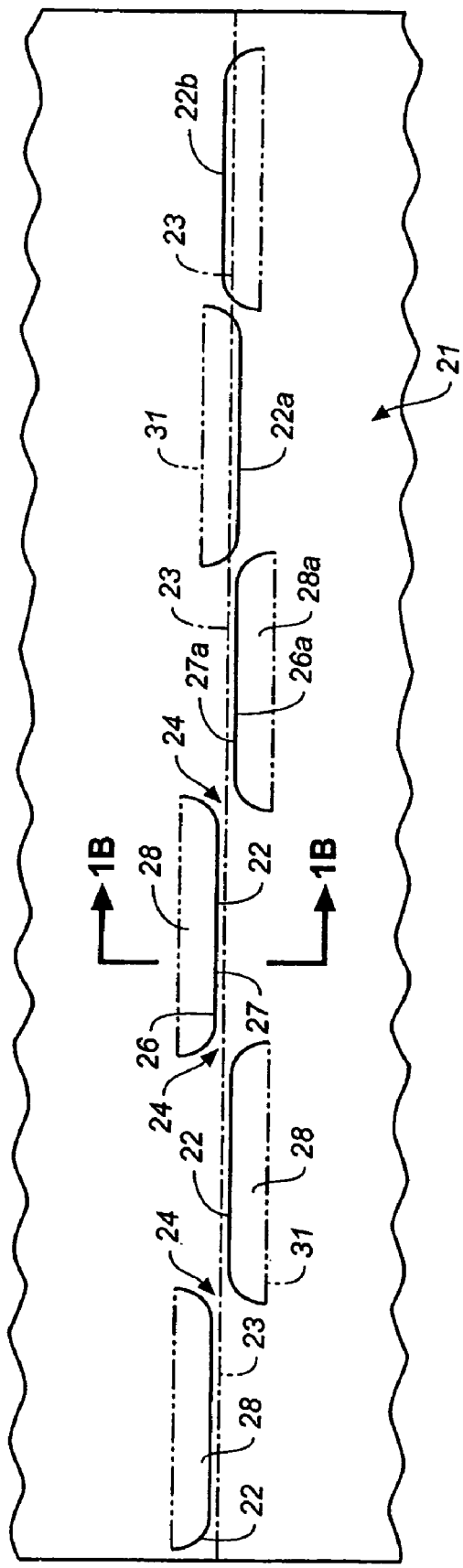
FIG._1A

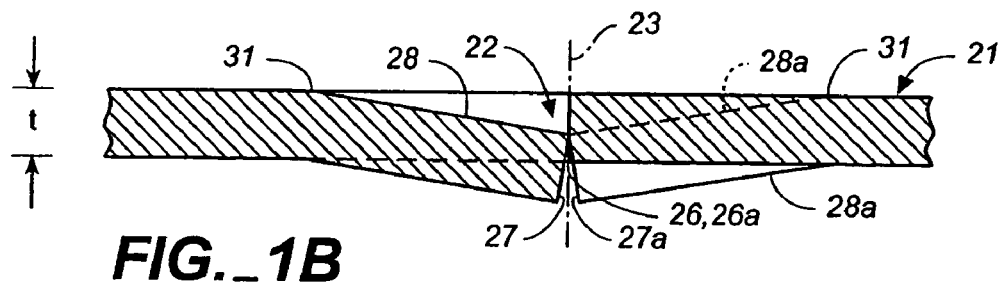
FIG._1B
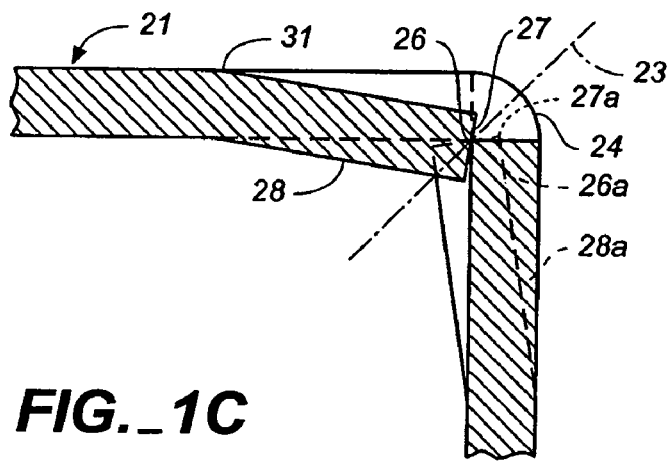
FIG._1C
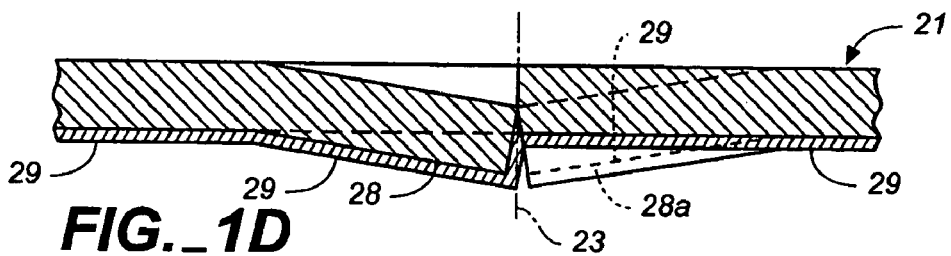
FIG._1D
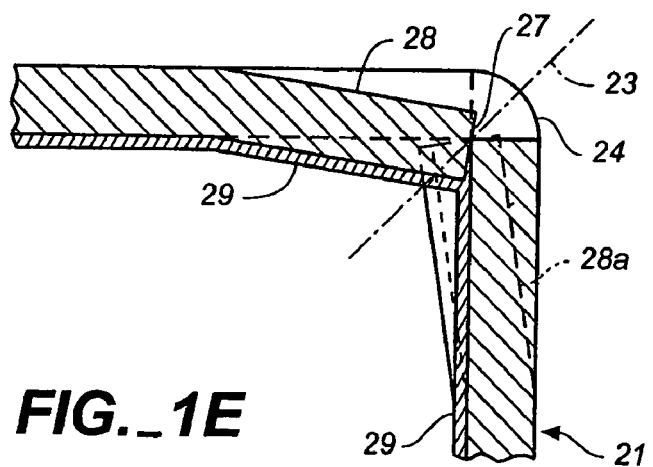
FIG._1E

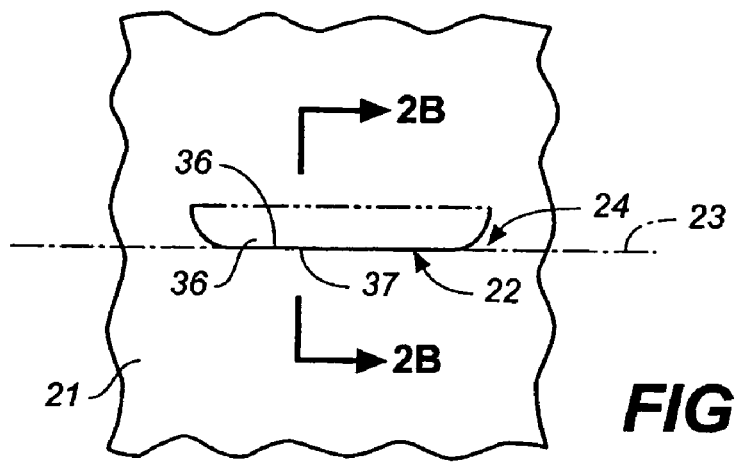
FIG._2A
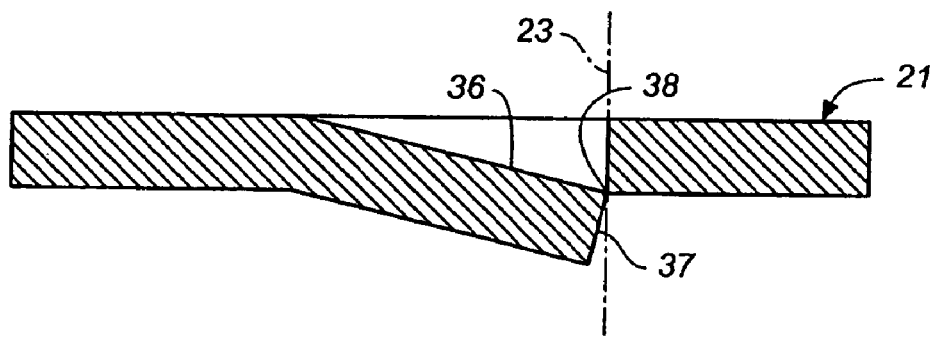
FIG._2B
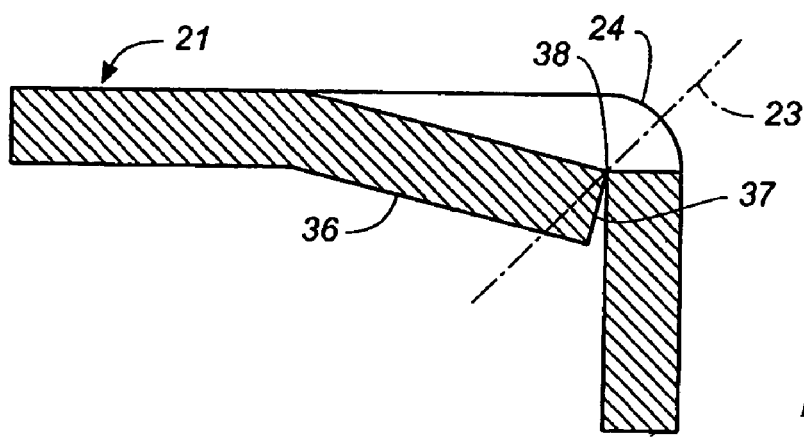
FIG._2C

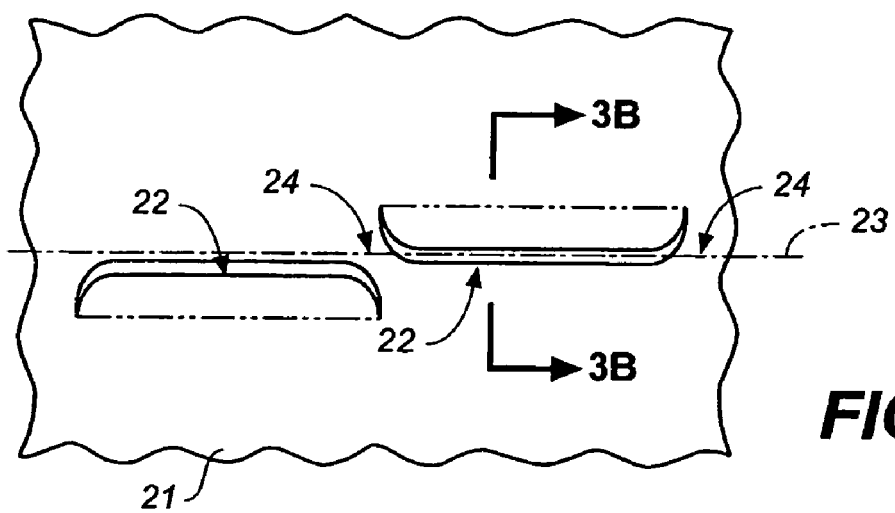
FIG._3A
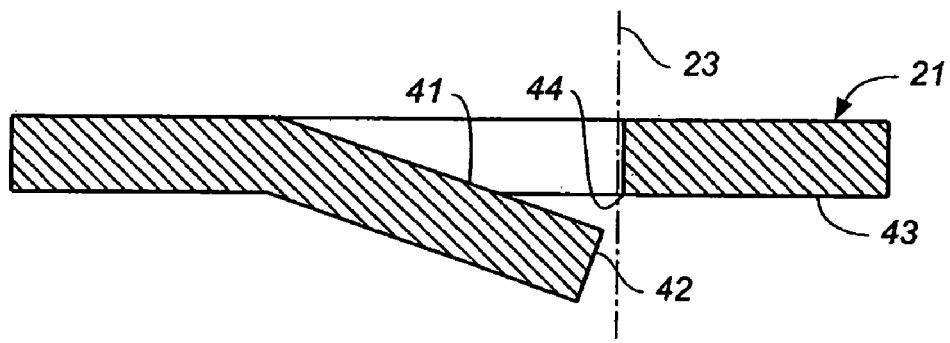
FIG._3B
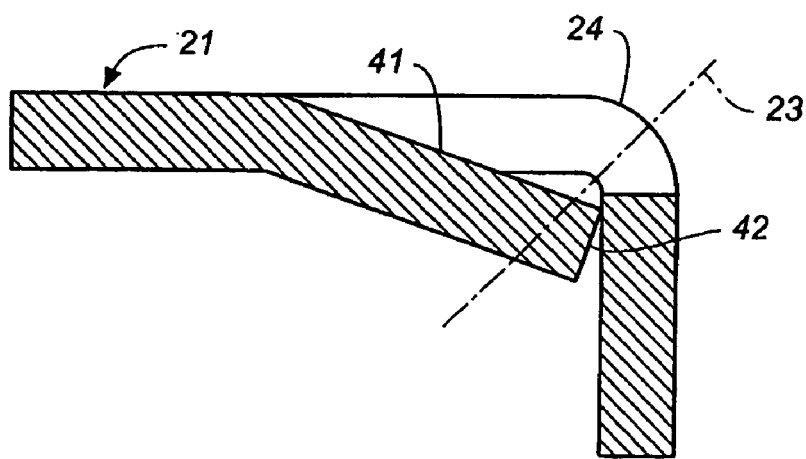
FIG._3C

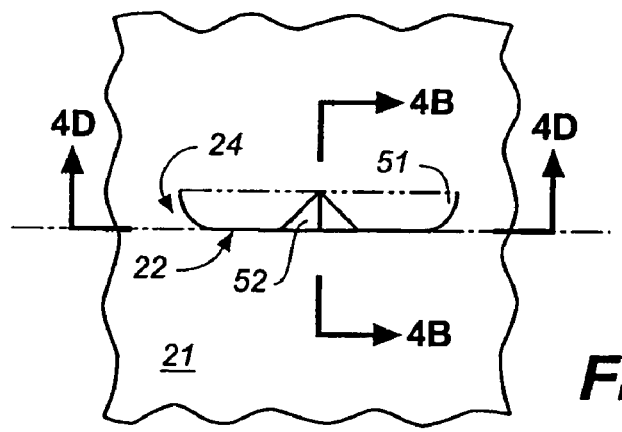
FIG._4A
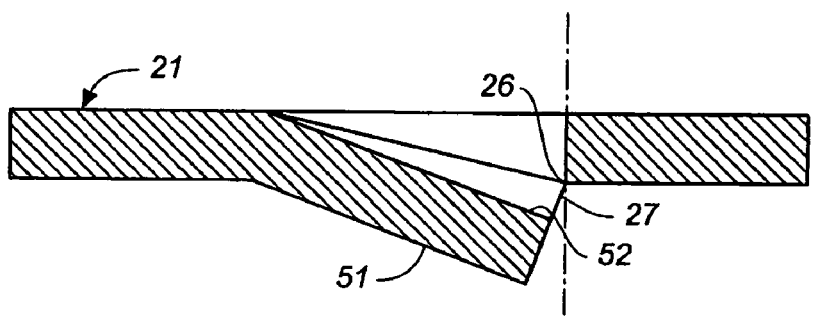
FIG._4B
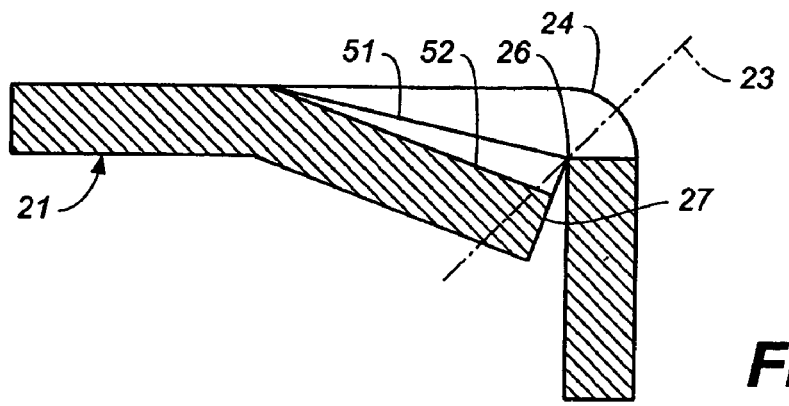
FIG._4C
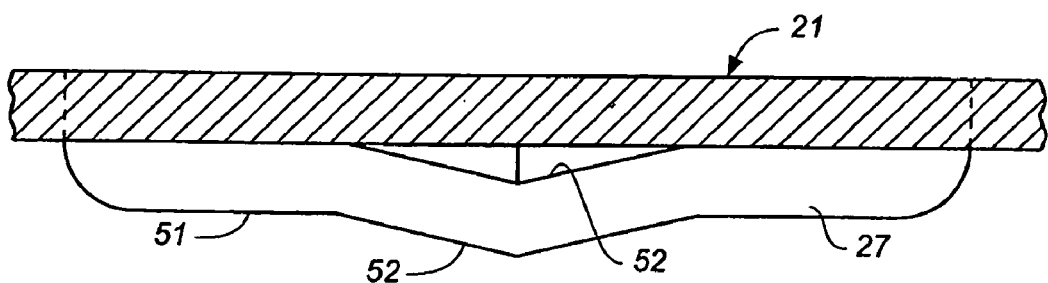
FIG._4D

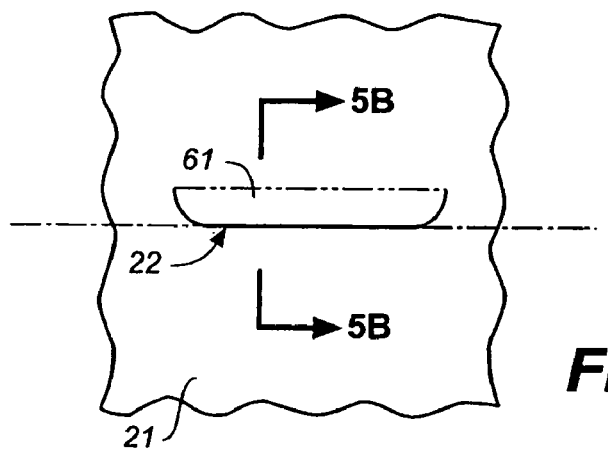
FIG._5A
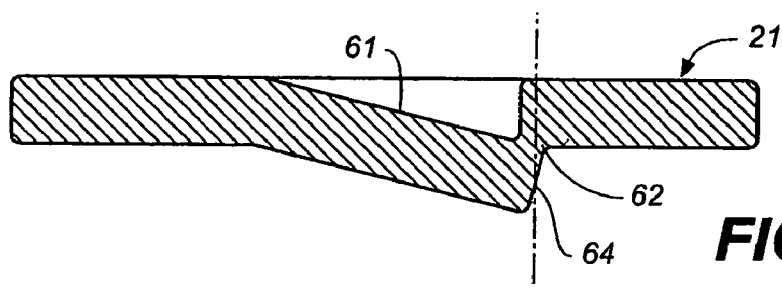
FIG._5B
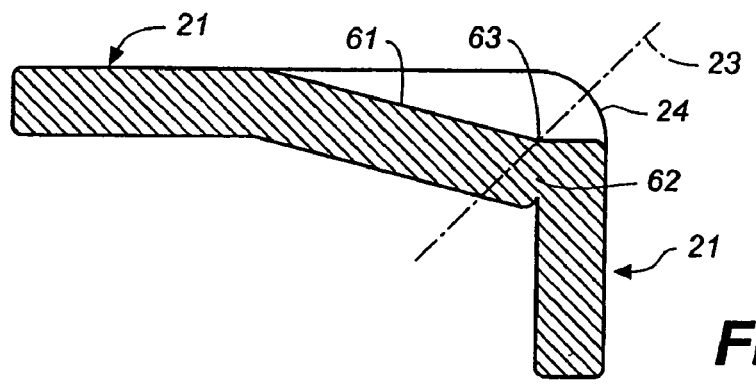
FIG._5C
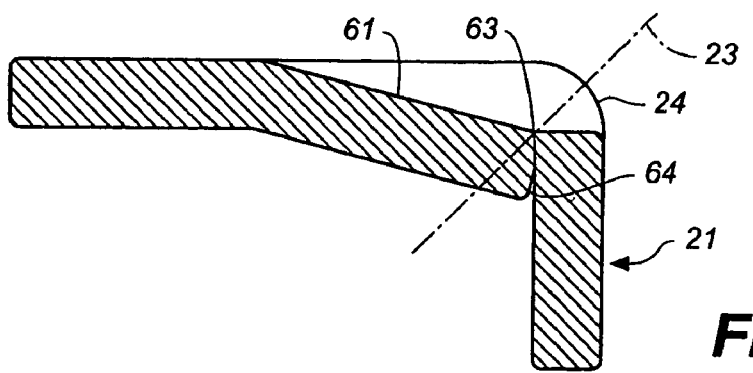
FIG._5D

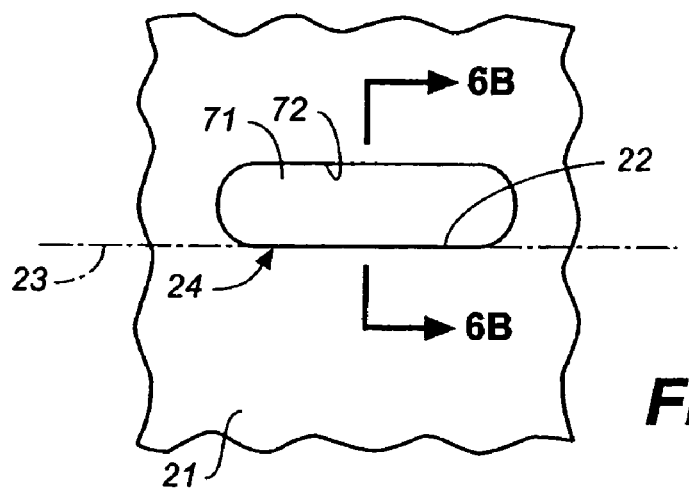
FIG._6A
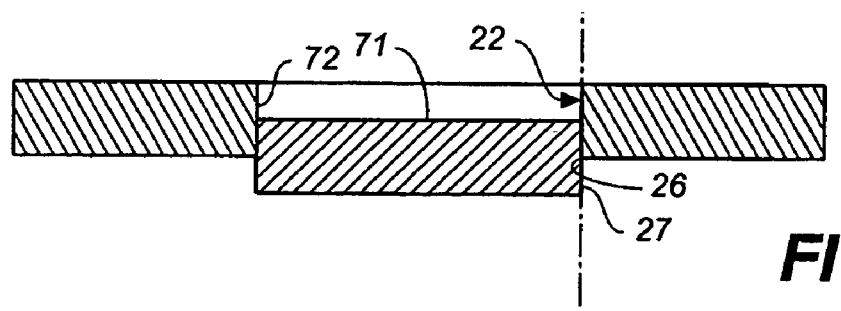
FIG._6B
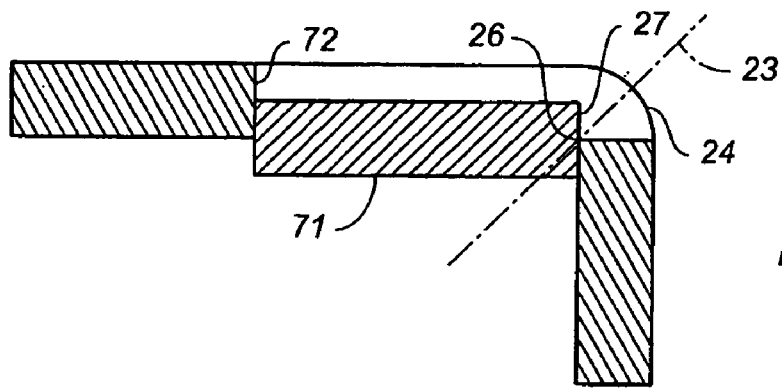
FIG._6C

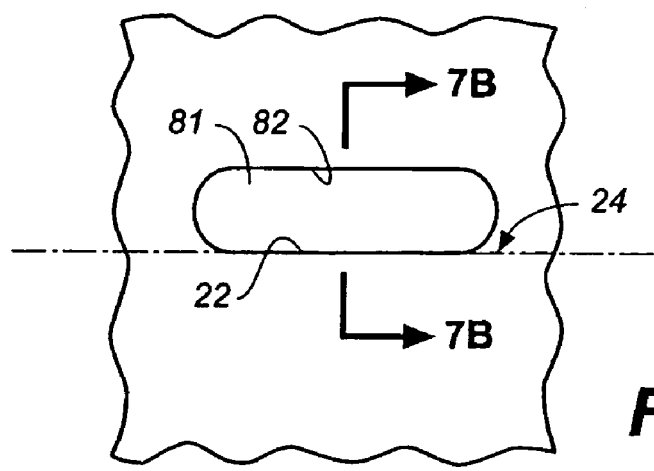
FIG._7A
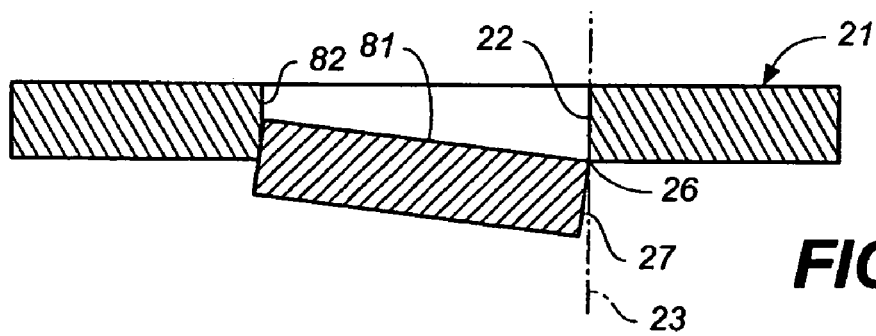
FIG._7B
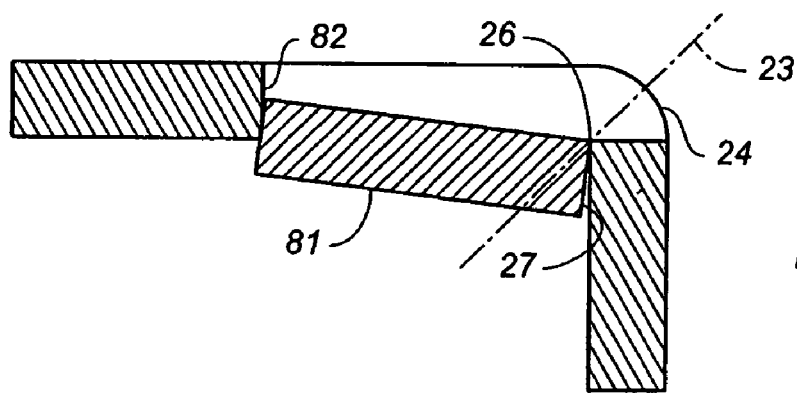
FIG._7C

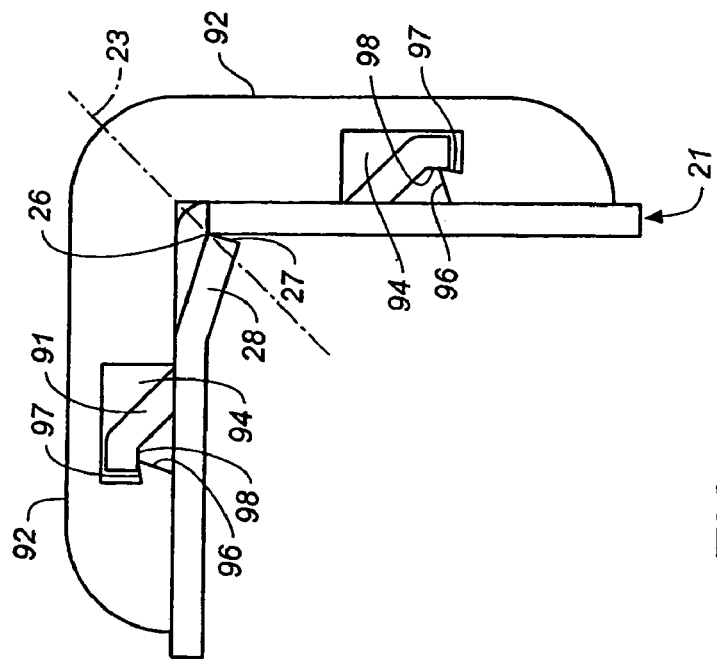
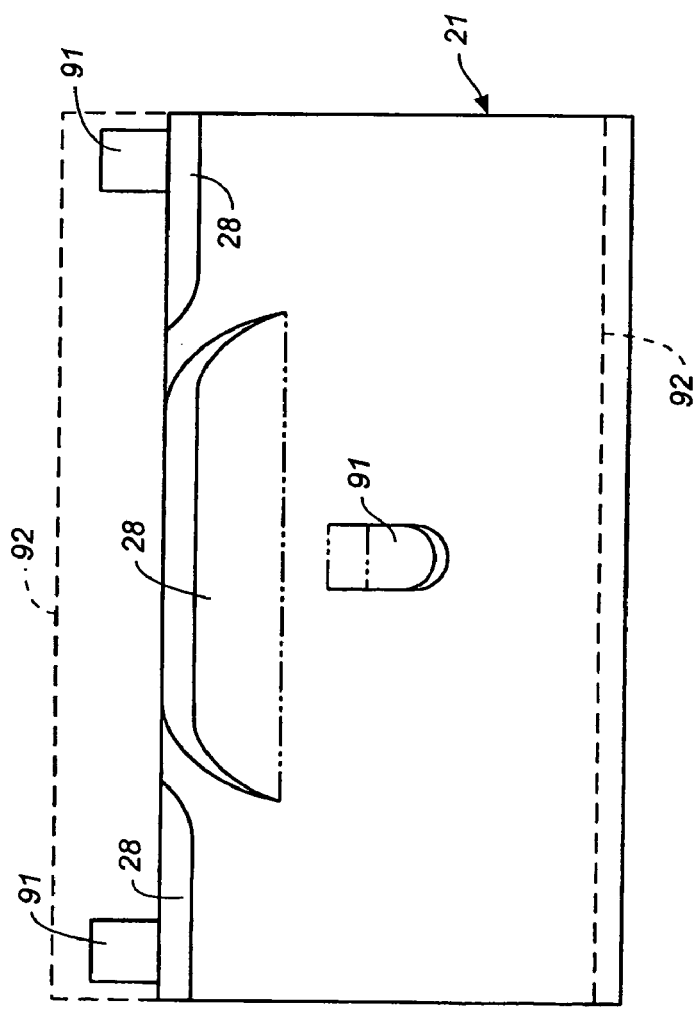
FIG._9
FIG._8

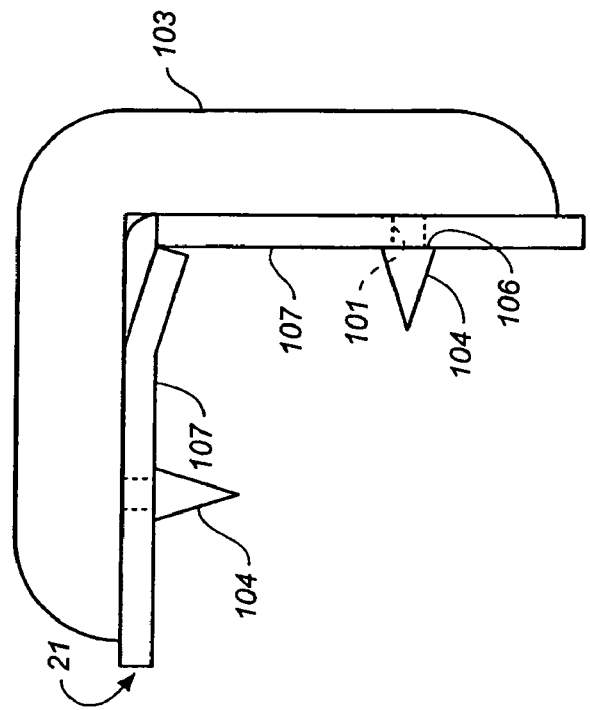
FIG._11
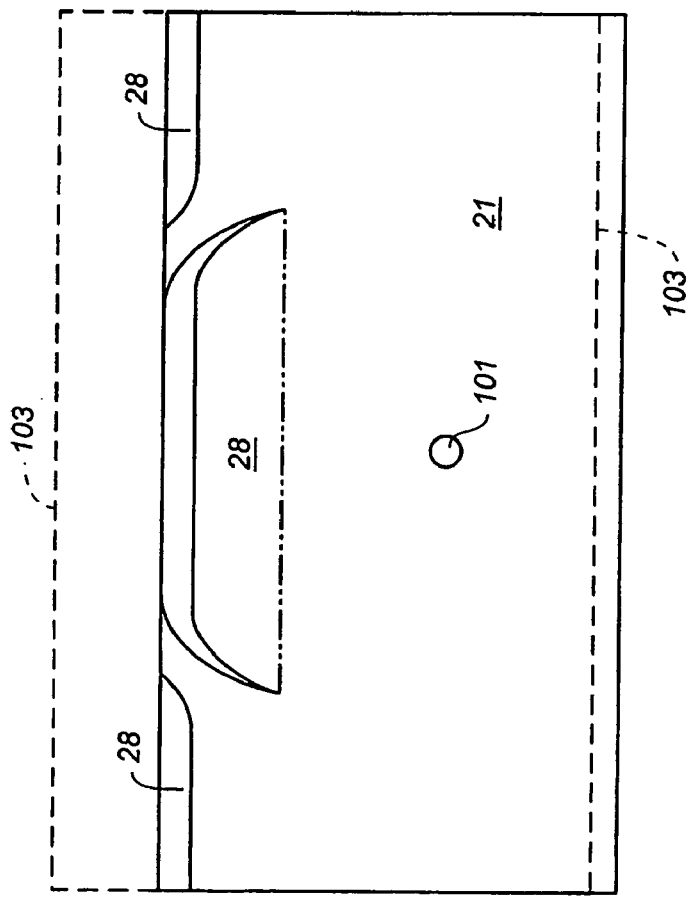
FIG._10

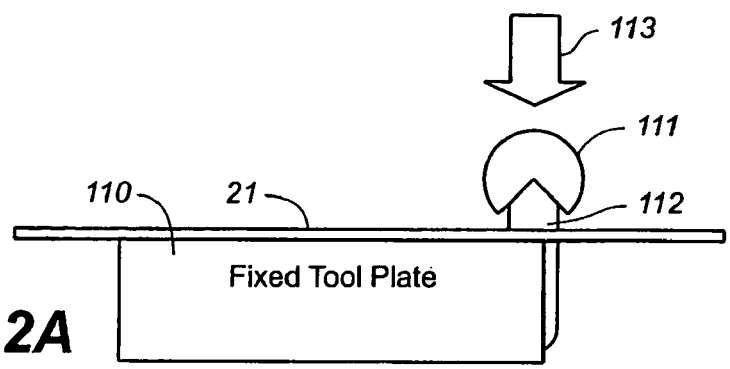
FIG._12A
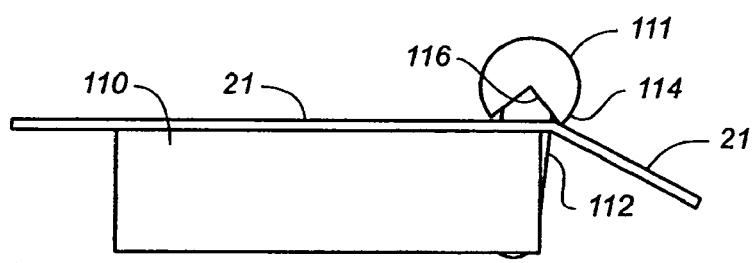
FIG._12B
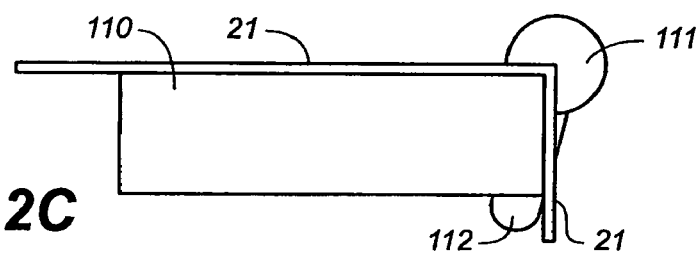
FIG._12C
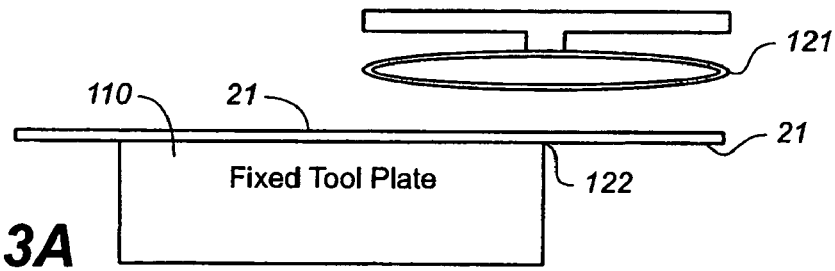
FIG._13A
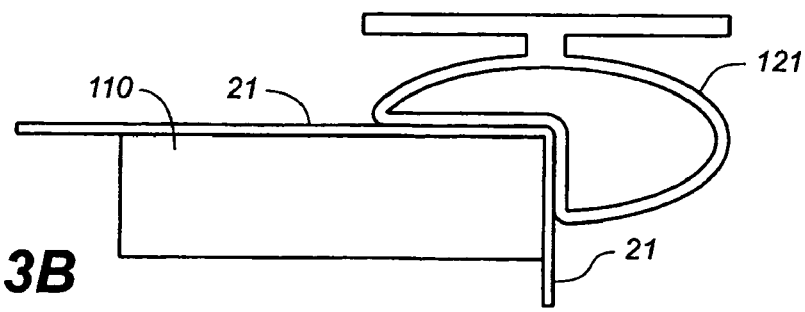
FIG._13B

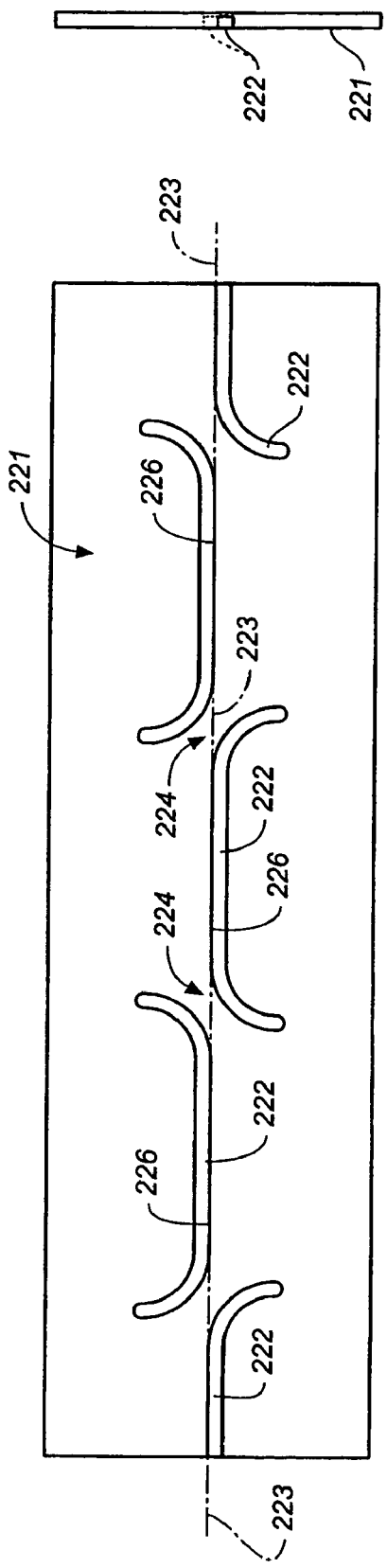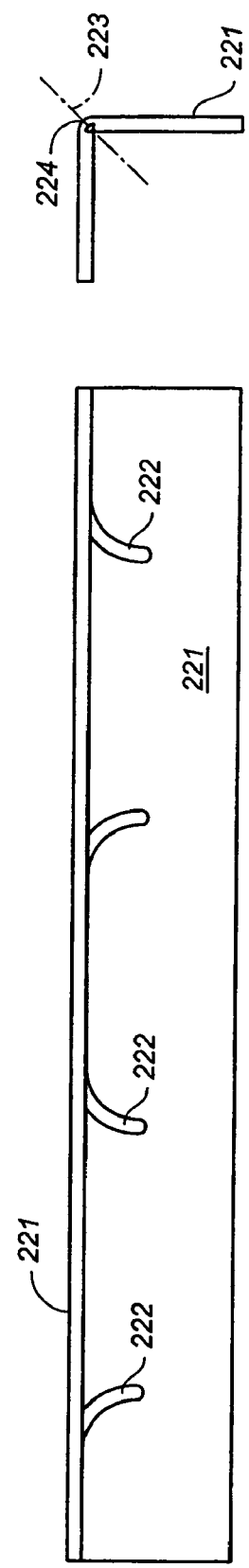
FIG._14A
FIG._14B
FIG._14C
FIG._14D

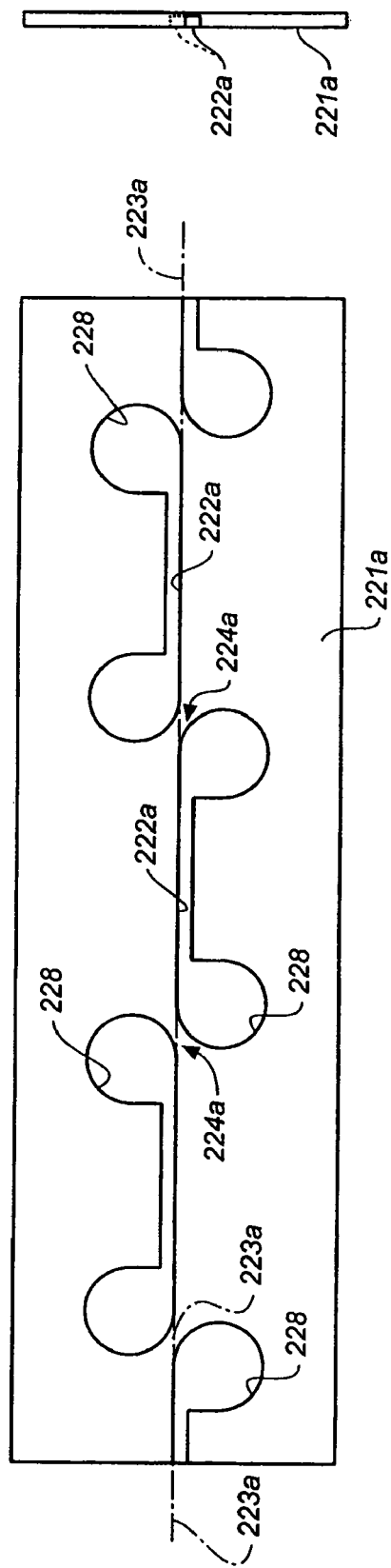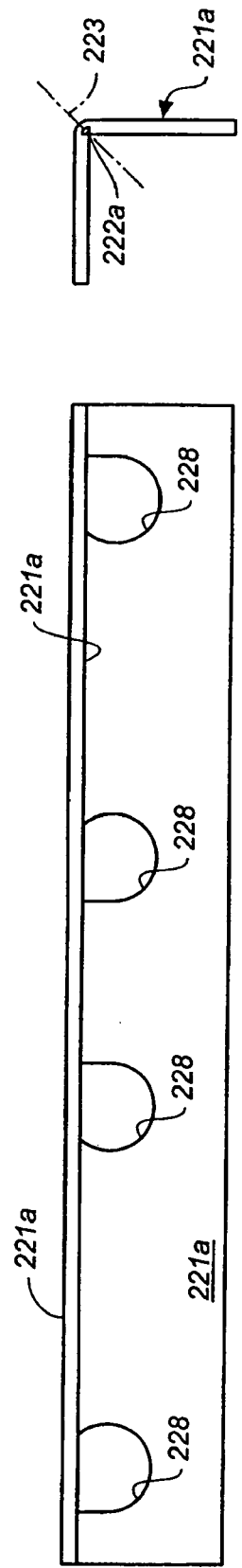
FIG._15A
FIG._15B
FIG._15C
FIG._15D

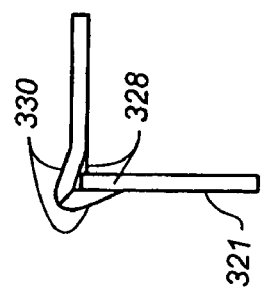
FIG._16B
FIG._16D
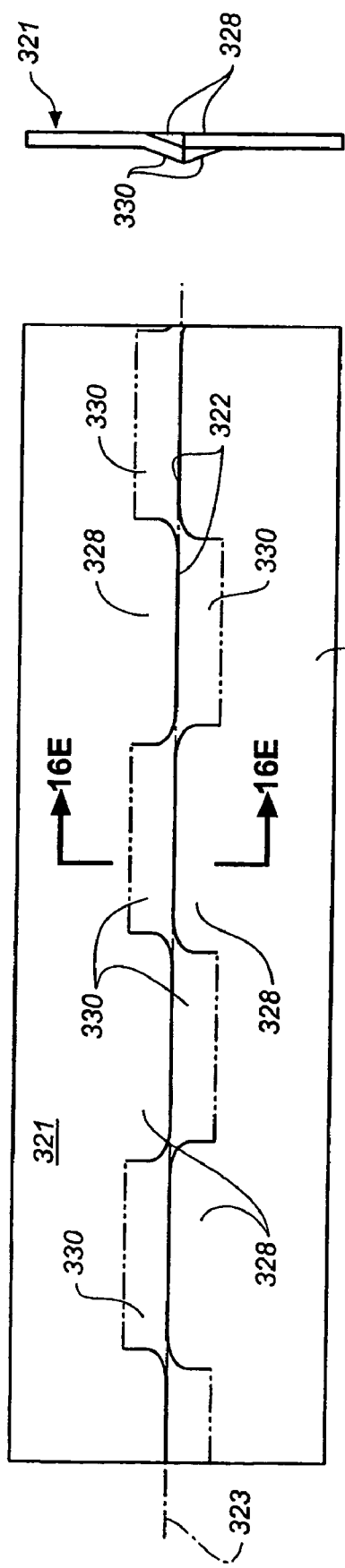
FIG._16A
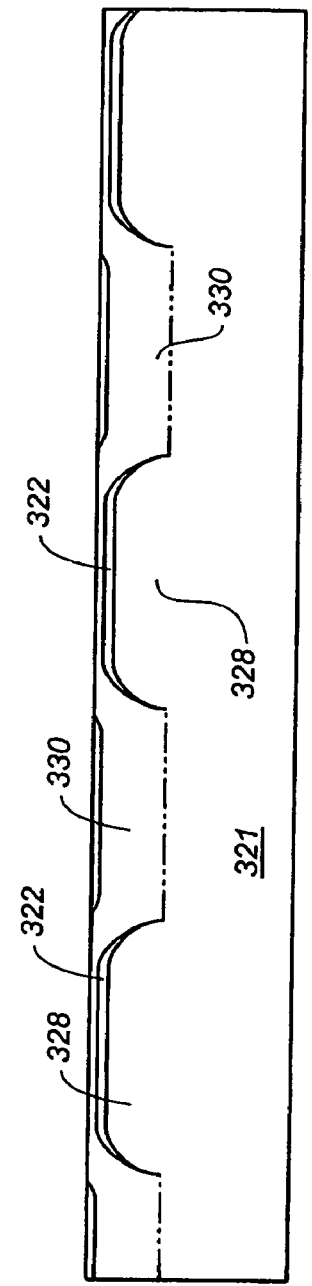
FIG._16C

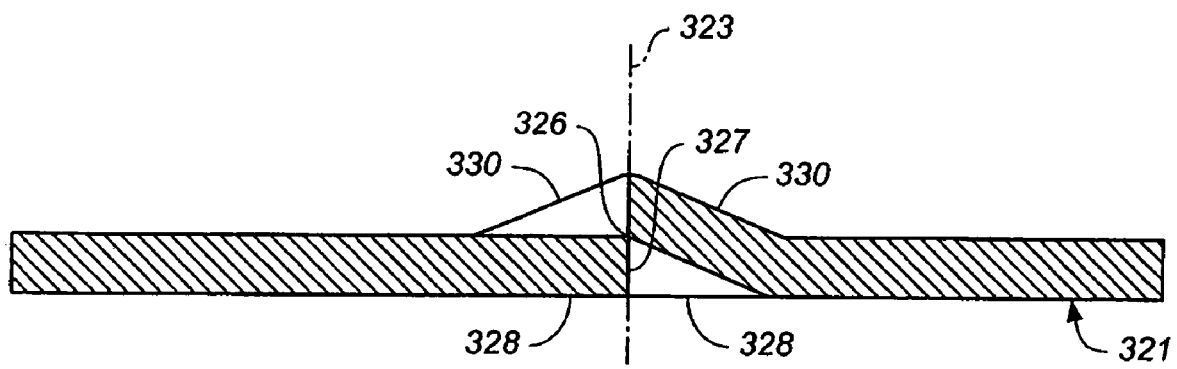
FIG._16E
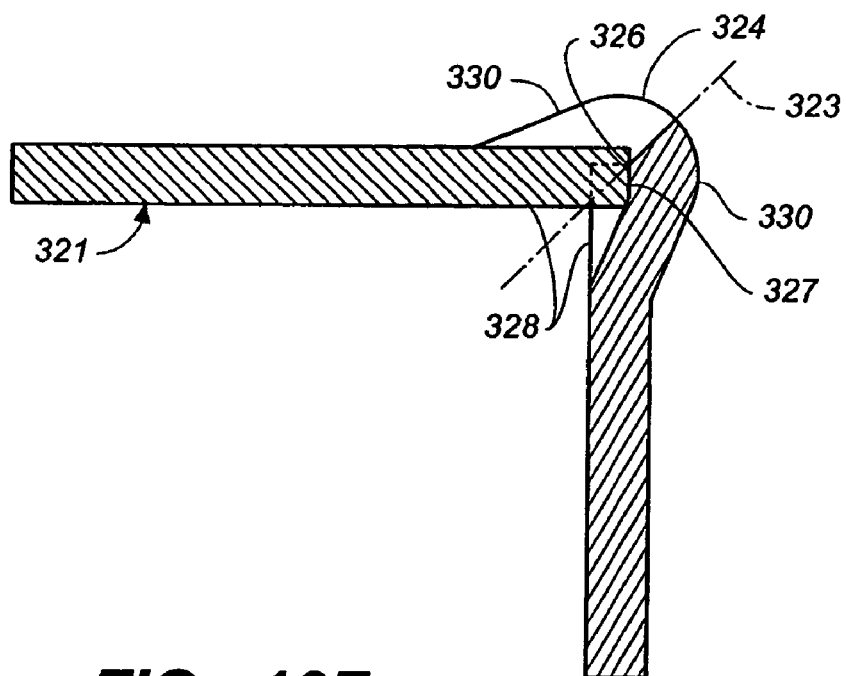
FIG._16F

SHEET MATERIAL WITH BEND CONTROLLING DISPLACEMENTS AND METHOD FOR FORMING THE SAME

RELATED APPLICATIONS

This application is a Continuation-in-Part of U.S. patent application Ser. No. 10/795,077 filed Mar. 3, 2004 and entitled SHEET MATERIAL WITH BEND CONTROLLING DISPLACEMENTS AND METHOD FOR FORMING THE SAME, now U.S. Pat. No. 7,152,450, which is a Continuation-in-Part of U.S. patent application Ser. No. 10/672,766 filed Sep. 26, 2003 and entitled Techniques for Designing and Manufacturing Precision-Folded, High Strength, Fatigue-Resistant Structures and Sheet Therefor, now U.S. Pat. No. 7,152,449, which is a Continuation-in-Part of U.S. patent application Ser. No. 10/256,870 filed Sep. 26, 2002 and entitled METHOD FOR PRECISION BENDING OF SHEET MATERIALS, SLIT SHEET AND FABRICATION PROCESS, now U.S. Pat. No. 6,877,349, which is a Continuation-in-Part of U.S. patent application Ser. No. 09/640,267 filed Aug. 17, 2000 and entitled METHOD FOR PRECISION BENDING OF A SHEET OF MATERIAL AND SLIT SHEET THEREFOR and now U.S. Pat. No. 6,481,259 B1, the entire contents of which applications is incorporated herein by this reference.

BACKGROUND OF THE INVENTION

1. Technical Field

The present invention relates, in general, to the precision folding of sheet material and, more particularly, relates to preparing the sheet material for bending using punching, stamping, roll-forming, embossing and similar processes, and then bending or folding the sheet into three-dimensional structures.

2. Description of Related Art

The present method and apparatus are based upon slitting and grooving geometries disclosed in depth in the above set forth related applications, which are each incorporated herein by reference in their entireties. In these related applications several techniques or manufacturing processes for forming slits and grooves that will precisely control bending of a wide variety of sheet material are disclosed, including laser cutting, water jet cutting, stamping, punching, molding, casting, stereo lithography, roll forming, machining, chemical-milling, photo-etching and the like. Some of these processes for fabricating bend-inducing slit geometries can be more expensive than others. For example, laser cutting will inherently involve additional cost as compared to, for example, punching or stamping, but punching and stamping may not be particularly well suited to sheet material of relatively heavy gauge.

The precision bending slit geometries of the above-identified related applications may be advantageously applied to numerous structures which are formed from relatively thin gauge sheet material. These structures tend to be more driven by the need for complex and precise bending patterns than they are by strength or fatigue resistance requirements. An example of one type of structure which can be formed of a relatively thin gauged sheet material, and yet requires precision and complex bending, is electronic component chassis, such as, computers, audio receivers, television sets, DVD players, etc.

As is noted in prior related U.S. patent application Ser. No. 10/672,766, flat sheets, which are slit or grooved in accordance with the teachings of that prior related application, can have electrical components mounted to the flat sheets using "pick-and-place" techniques. The sheets may then be folded into enclosures or housings in which all of the components are spatially related in the desired positions inside the housing. The "pick-and-place" techniques greatly reduce cost, as does the ability to fold a flat sheet into a precisely dimensioned enclosure using relatively low-force bending techniques. While such electronic chassis can be formed using laser cutting or water jet cutting, there is considerable advantage if lower cost slit-forming or groove-forming techniques can be employed. Thus, lower cost fabrication processes such as punching, stamping, roll-forming or the like, will be highly advantageous to use with relatively thin gauge material if they do not lose the precision advantages that the slits geometries of the related applications can produce.

Moreover, slit-forming techniques, such as punching, stamping and roll-forming, can produce slits which have essentially zero kerf or slit width dimension, while laser and water jet cutting remove material and product slits having a measurable kerf or width dimension. Sheets having zero kerf slits have the advantage of being more closed along the bend line after the sheets are bent. Thus, they do not tend to open up as much during bending as sheets having measurable kerf dimensions. This makes the zero kerf sheets amenable to coating with a protective layer that will seal and close the bend line to allow them to be used in applications in which electro-magnetic shielding, corrosion resistance, attractive appearance, or fluid tightness is required.

Accordingly, it is an object of the present invention to provide a method for preparing sheet material for precision bending along a bend line, which method is relatively low in cost and adaptable to a wide range of applications employing sheet material.

A further object of the present invention is to provide a low cost method for preparing sheet material for bending, which method is capable of precise bending free of cumulative bending errors, is suitable for complex bending patterns, and requires only minimal force to effect bending.

Another object of the present invention is to provide a sheet of material for bending in which slits or grooves are formed using low-cost manufacturing processes that are capable of producing structures which can be sealed, are fluid-tight, corrosion resistant or must have an attractive appearance.

The bendable sheet material and bend-inducing sheet forming method of the present invention have other objects and features of advantage which will be set forth in more detail hereinafter in the following Best Mode of Carrying Out the Invention, as exemplified and illustrated by the accompanying drawing.

DISCLOSURE OF THE INVENTION

The method of preparing a sheet of material for bending along a bend line of the present invention is comprised, briefly, of the step of forming at least one displacement in the thickness direction of the sheet of material with the portion of the periphery of the displacement closest to the bend line providing an edge and an opposed face configured and positioned to produce edge-to-face engagement of the sheet of material during bending. The displacement is preferably formed using one of a punching, stamping, roll-forming, embossing, chemical milling or etching process in which dies, machine tools, a knife or chemical agent form a slit or shear line of zero kerf or a groove in the sheet material. When dies are employed, the periphery of the displacement caused by the die, which is closest to the bend line is sheared at least partially, and often completely, through the thickness dimension of the sheet of material proximate the bend line. Most preferably, a plurality of displacements are formed along the bend line, with alternate displacements being positioned on opposite sides of the bend line. In the most preferred form the periphery which is closest to the bend line is, in fact, superimposed on the bend line so that the jog distance between displacements on opposite side of the bend line is essentially zero. The displacements, however, can have a jog distance in the range of about −0.5 to about +0.5 times the thickness dimension of the sheet. The displacements also may be plastically deformed by die sets to produce the opposing edge and face structures. Upon bending, the sheet of material may not fracture or rupture along the plastically deformed displacements, so that the bend will be maintained as a fluid-tight continuous structure along the bend line, or it may rupture to provide a face and opposed edge similar to sheared sheets. While it is preferred to displace the tongues which are defined inside the slits or grooves, it also is possible to displace the areas longitudinally between the slits or groove and still achieve edge-to-face precision bends. Moreover, the bending direction is preferably in the direction of displacement of the tongues, but if lower precision can be tolerated bending can be in the opposite direction.

A sheet of material suitable for bending along a bend line is also provided which comprises, briefly, a sheet having at least one displacement in the thickness direction of the sheet, with a portion of the displacement closest to the bend line providing an edge and an opposing face configured to produce edge-to-face engagement of the sheet of material on opposed sides of the portion of the periphery during bending. Most preferably a plurality of displacements are positioned along the bend line on alternating sides of the bend line. A continuous layer of coating material can be placed on the sheet before bending to further insure that resulting bend will be fluid-tight, corrosion resistant and attractive. The displacements in the sheet of material can extend partially through the sheet or completely through it, and the sheet can be bent in the direction of the displacements for maximum precision or in an opposed direction by relying on the oblique bending straps to control the precision. Optionally, but less desirably, the sheet may be bent in the opposite direction when the precision achievable by edge-to-face bending is not required.

One aspect of the present invention is directed to a method of preparing a sheet of material for bending along a bend line comprising the step of forming at least one displacement in the thickness direction of the sheet of material, the displacement including a flat zone substantially parallel to the sheet of material with a portion of the periphery of the flat zone extending along and adjacent to the bend line. The displacement also includes an angled transition zone interconnecting the flat zone with a remainder of the sheet of material. The forming step preferably provides the portion of the periphery adjacent the bend line with an edge and the sheet of material with a corresponding opposed face configured and positioned to produce edge-to-face engagement of the sheet of material during bending. The forming step may shear the sheet of material entirely through the thickness dimension along the portion of the periphery. The forming step may be accomplished using one of a stamping process, a punching process, a roll forming process, a shearing knife-based and an embossing process.

In one embodiment, a plurality of displacements may be formed in the sheet of material along the bend line with each displacement having a flat zone having a periphery portion proximate the bend line to provide a plurality of edges and opposed faces for edge-to-face bending of the sheet of material. Each flat zone may have the periphery portion substantially superimposed on the bend line. The forming step may be accomplished using one of a stamping process, a punching process, a roll forming process, a shearing knife-based and an embossing process. The forming step may be accomplished using a turret press to form each of the plurality of displacements, wherein the turret press is relocated with respect to the sheet of material to the desired location of each of the plurality of displacements. The forming step may be accomplished using a modular die set including a number of die units corresponding in number to the number of displacements. The plurality of displacements may be differently sized, wherein the die units are similarly differently sized and complementary in number and size to the plurality of displacements.

In one embodiment, the periphery portion of displacements may be positioned on opposite side of the bend line at a jog distance from each other less than the thickness dimension of the sheet of material. The jog distance may be in the range of about −0.5 to about +0.5 times the thickness dimension of the sheet of material. The peripheral portions of displacements may be positioned on opposite sides of the bend line to define bending straps oriented to extend obliquely across the bend line. The bending straps may have a strap width that is approximately 2-5 times the thickness of the material.

A layer of coating material may be adhered to the sheet of material across the portion of the periphery of the displacement. The adhering step may form a continuous layer of flexible coating material.

Preferably, the flat zone is elongated and includes curved ends. The periphery of the curved ends may be semicircular in shape.

The method may further include the step of bending the sheet of material along the bend line. The bending step may be accomplished manually.

Another aspect of the present invention in directed to a sheet of material suitable for bending along a bend line, wherein the sheet may be formed by any one of the above methods. Preferably, the sheet of material has at least one displacement in a thickness direction of the sheet of material, the displacement including a flat zone substantially parallel to the sheet of material with a portion of the periphery of the displacement extending along and adjacent to the bend line, and including an angled transition zone interconnecting the flat zone with a remainder of the sheet of material.

BRIEF DESCRIPTION OF THE DRAWING

FIG. 1A is a fragmentary, top plan view of a sheet of material having bend controlling displacements formed therein in accordance with the present invention.

FIG. 1B is an enlarged, fragmentary, end elevation view, in cross section of the sheet of FIG. 1A, taken substantially through the plane of line 1B-1B in FIG. 1A.

FIG. 1C is a cross sectional view corresponding to FIG. 1B with the sheet having been bent by 90 degrees from the flat condition of FIG. 1B.

FIG. 1D is a cross sectional view corresponding to FIG. 1B of an alternative embodiment of the sheet in which a protective coating adhered to the sheet of material.

FIG. 1E is a cross sectional view corresponding to FIG. 1C of the bent coated sheet of FIG. 1D.

FIG. 2A is a fragmentary, top plan, schematic view of a sheet of material corresponding to FIG. 1A with only a single displacement or sheared tongue being shown for ease of understanding.

FIGS. 2B and 2C are views corresponding to FIGS. 1B and 1C of the sheet shown in FIG. 2A.

FIG. 3A is a fragmentary, top plan, schematic view of a sheet of material corresponding to FIG. 1A with only a single displacement or sheared tongue being shown, which tongue has been sheared and displaced beyond the sheet thickness dimension.

FIGS. 3B and 3C are views corresponding to FIGS. 1B and 1C of the sheet of FIG. 3A.

FIG. 4A is a fragmentary, top plan, schematic view of a sheet of material corresponding to FIG. 1A having an alternative embodiment of a single tongue having a reinforced central tongue deformation.

FIGS. 4B and 4C are views corresponding to FIGS. 1B and 1C of the sheet of FIG. 4A.

FIG. 4D is a cross section view taken substantially along the plane of line 4D-4D in FIG. 4.

FIG. 5A is a fragmentary, top plan, schematic view of a sheet of material corresponding to FIG. 1A having an alternative embodiment of a single tongue which has been plastically deformed and displaced in the thickness direction of the sheet.

FIGS. 5B and 5C are views corresponding to FIGS. 1B and 1C of the sheet of FIG. 5A.

FIG. 5D is a view corresponding to FIG. 5C in which the sheet has fractured or ruptured during bending.

FIG. 6A is a fragmentary, top plan schematic view of a sheet of material corresponding to FIG. 1A in which an alternative embodiment to a displacement having a continuous periphery is shown partially sheared through the thickness dimension of the sheet.

FIGS. 6B and 6C are views corresponding to FIGS. 1B and 1C of the embodiment of the sheet of FIG. 6A.

FIG. 7A is a fragmentary, top plan, schematic view of a sheet of material corresponding to FIG. 6A in which the displacement in the sheet has been sheared only partially through one side of the periphery and completely through an opposite side of the periphery.

FIGS. 7B and 7C are views corresponding to FIGS. 1B and 1C of the sheet of FIG. 7A.

FIG. 8 is a front elevation view of a bent sheet of material having displacements of the type shown in FIGS. 2A-2C with a bend-covering shin guard, shown in broken lines, and illustrating upstanding securement tabs.

FIG. 9 is an end elevation view of the sheet of material of FIG. 8 with the shin guard shown in solid lines mounted to the securement tabs.

FIG. 10 is a front elevation view of an alternative embodiment of bent sheet of material with a shin guard shown in broken lines and an attachment structure.

FIG. 11 is an end elevation view of the sheet of material of FIG. 10 with the shin guard shown in solid lines mounted to the sheet by the attachment structure.

FIG. 12A is a side elevation schematic view of a sheet of material formed in accordance with the present invention and positioned on a fixed tool plate for bending by a rotary cylinder and movable linkage.

FIG. 12B is a side elevation schematic view of the sheet of material of FIG. 12A after partial bending of the sheet on the tool plate.

FIG. 12C is a side elevation schematic view of the sheet of material of FIG. 12A after a 90 degree bend.

FIG. 13A is a side elevation schematic view of a sheet of material formed in accordance with the present invention and positioned on a fixed tool plate for bending by a pneumatic bending bladder.

FIG. 13B is a side elevation schematic view of the sheet of material of FIG. 13A after a 90 degree bend.

FIG. 14A is a top plan, schematic view of a sheet of material that has been grooved in accordance with the present invention.

FIG. 14B is an end view of the sheet of FIG. 14A.

FIG. 14C is a side elevation view of the sheet of FIG. 14A with the half of the sheet above the bend line shown bent outwardly of the page.

FIG. 14D is an end view of the sheet as bent in FIG. 14C.

FIG. 15A is a top plan schematic view of a sheet of material that has been grooved and provided with stress relieving features in accordance with an alternative embodiment of the present invention.

FIG. 15B is an end view of the sheet of FIG. 15A.

FIG. 15C is a side elevation view of the sheet of FIG. 15A with the half of the sheet above the bend line shown bent outwardly of the page.

FIG. 15D is an end view of the bent sheet of FIG. 15C.

FIG. 16A is a top plan schematic view of a sheet of material having shear lines controlling bending and having the areas between longitudinal adjacent shear lines on the same side of the bend line displaced to produce edge-to-face bending.

FIG. 16B is an end view of the bent sheet of FIG. 16A.

FIG. 16C is a side elevation view of the sheet of FIG. 16A with the upper half of the sheet shown bent into the page.

FIG. 16D is an end view of the bent sheet of FIG. 16C.

FIG. 16E is an enlarged, cross sectional view of the sheet of FIG. 16A, taken substantially along the plane of line 16E-16E in FIG. 16A.

FIG. 16F is a cross sectional view of the sheet of FIG. 16E as bent by ninety degrees.

DETAILED DESCRIPTION OF THE INVENTION

Figure 17:
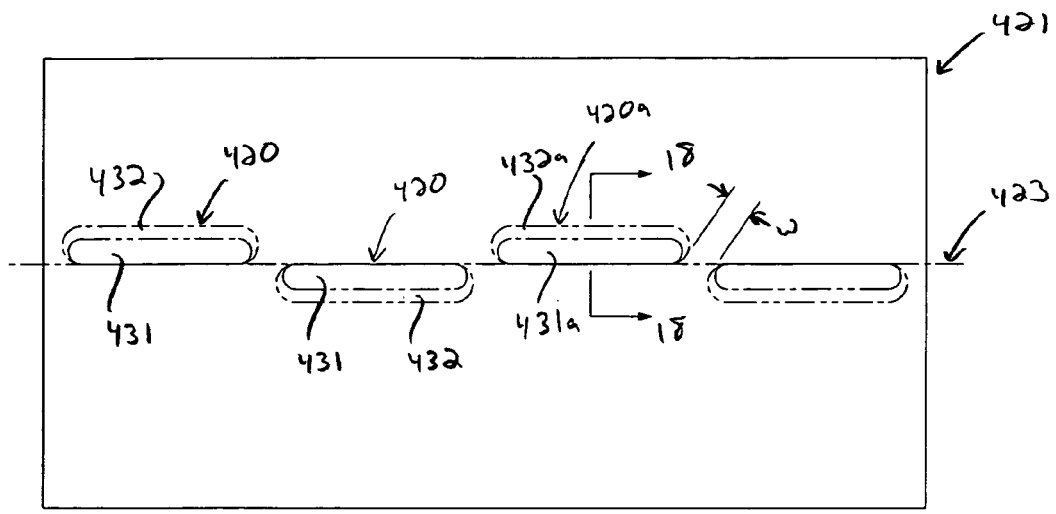
FIG. 17 is a fragmentary, schematic top plan views similar to FIG. 1 of another sheet of material having bend controlling displacements formed therein.

Reference will now be made in detail to the preferred embodiments of the present invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention, as defined by the appended claims.

The present method and apparatus for precision bending of sheet material is based upon the slitting geometries disclosed in the above-identified prior related applications, which are incorporated herein by reference in their entireties.

As noted in connection with the prior related applications, processes for forming the slits which will control and precisely locate the bending of sheet material include such processes as punching, stamping, roll-forming, machining, photo-etching, chemical machining and the like. These processes are particularly well suited for lighter weight or thinner gauge material, although they also can be employed for sheet material of relatively heavy gauge. The thicker or heavier gauged materials often are more advantageously slit or grooved using laser cutting or water jet cutting equipment.

As described in the prior related applications, one highly advantageous application for the precision bending of sheet material is in connection with electronic component chassis. Such chassis often are highly complex so as to enable the positioning of a multiplicity of components in three-dimensional arrays inside the eventual housing for the electronic equipment. Since laser cutting and water jet cutting are both somewhat more expensive, it is particularly desirable to be able to form chassis for electronic equipment, and numerous other lower cost housings and the like, using low cost, high-production techniques such as punching, stamping, roll forming and the like. The present application, therefore, illustrates how these lower cost fabrication processes can be applied to relatively thinner gauged sheet material with great advantage.

Turning now to FIGS. 1A-1C, a sheet of material generally designated 21, is shown in FIG. 1A having a plurality of slits 22 positioned proximate and along a bend line 23. The slits can be seen to have ends which curve away from bend line 23, and the curved slit ends define therebetween bending straps 24 that have center lines that extend obliquely across bend line 23, in a manner described in substantial detail in prior related application Ser. No. 10/672,766. As will be seen, longitudinally adjacent slits 22 are positioned alternatively on opposite sides of bend line 23 along the length of the bend line, which is the preferred arrangement, but is not absolutely required.

As also may be seen in FIG. 1A, slits 22 are positioned in a laterally displaced positions from bend line 23, but this has been done primarily to illustrate the position of the bend line. In the most preferred form of the invention, when light gauge materials are being prepared for bending, slits 22 will be substantially superimposed on bend line 23. This is preferred because it facilitates the use of the same die sets for a wider range of sheet material thicknesses.

As described in prior related U.S. patent application Ser. No. 10/672,766, the "jog" distance between slits 22 is defined as the lateral distance between the slits on opposite sides of the bend line. In the most preferred form of the embodiments in the present application, therefore, the jog distance is substantially equal to zero, that is, the slits are positioned precisely on bend line 23 so that there is no lateral spacing between slits on the opposite sides of the bend line, except at the curved ends. As indicated in the prior related applications, the jog distance between slits relative to bend line 23 is preferably less than the thickness dimension of sheet 21. Obviously, a jog distance of zero meets that requirement.

Additionally, as can be seen for slits 22a and 22b at the right hand end of sheet 21, a negative jog distance also can be employed. As will be seen, slit 22a extends across bend line 23, as does slit 22b. This is acceptable within the teaching of the present invention and will produce the edge-to-face bending along bend line 23 that is desired for precise, controlled bending. For the thinner gauged materials typically employed in electronic equipment chasses, the jog distance between slits 22 is preferably in the range of about $-0.5$ to about $+0.5$ times the thickness dimension, t, (FIG. 1B) of sheet 21. As the jog distance between slits becomes increasingly negative over about $-0.5$ times the thickness of the sheet of material, there is a tendency for the sheet to bend along two bend lines, which bends are positioned at the edges of the slits, rather than a single bend line positioned between the edges of the slits. At about 0.8 times the thickness of the sheet, for example, the two bend line phenomena has been seen to occur in 0.060 sheet metal.

When a negative jog distance is employed with slits 22 having a zero kerf dimension, the slit will remain relatively closed along its length even after a 90 degree bend. If the slit is formed with a kerf, for example, by laser cutting, and a negative jog distance is employed, there is a tendency for the material on opposite sides of the slit to separate or "daylight" upon bending, for example, to 90 degrees. This, however, can be entirely acceptable, depending upon the application.

As will be described in considerable detail below, the most preferred approach to punching or stamping slits into sheet 21 is to displace a tongue or enclosed area of slug in the thickness direction of the sheet by dies which shear the sheet. It will be understood from prior related applications, however, that slits 22 also can be formed as shear lines or slits in which there is no displacement of the sheet, for example, by using a knife, rather than a die that also displaces a portion of the sheet. One of the advantages of forming a displacement in the sheet, rather than slitting it with a knife, is that edge-to-face sliding of material on opposite sides of slits 22 is reduced or not required. The displacement of the sheet also reduces the bending forces required by insuring that each edge and face will move in the right direction during bending.

In the preferred form, slits 22 are formed by displacement in a thickness direction so that a portion of the periphery of the displacement closest to bend line 23 provides an edge 26 and an opposed face 27 configured and positioned to produce edge-to-face engagement of the sheet of material on opposite sides of the periphery during bending. As shown in FIG. 1B, a D-shaped tongue 28 has been downwardly displaced to provide a face 27 against which a lower corner 26 or edge on the opposite side of slit 22 from tongue 28 will engage when sheet 21 is bent. As illustrated best in FIGS. 1B and 1C, a portion of the slit periphery is superimposed on the plane of bend line 23. The next slit, which is into the page in FIG. 1B, has a similar D-shaped tongue 28a which has been downwardly displaced to provide a face 27a against which an edge 26a will engage.

When sheet 21 is bent, for example, by 90 degrees, edges 26, 26a pivot around and engage faces 27,27a at about a midpoint in the faces. As bending continues, they act as opposed fulcrums which are positioned on bend line 23 (that can be seen in FIG. 1C to have rotated by 45 degrees). Thus, almost immediately as the bend begins, the edges 26,26a are rotated into engagement with faces 27,27a, with result that bending is very precisely controlled to occur about bend line 23. The obliquely oriented bending straps 24 pull and maintain edges 26,26a against faces 27,27a during bending to maintain the fulcrums in contact with the opposed faces. This edge-to-face engagement is described in even more detail in the prior related applications.

The illustrations in FIGS. 1A and 1B are greatly enlarged in thickness to enable the edge-to-face contact to be more clearly illustrated. It will be understood, however, that sheet 21 can be relatively thin, for example, 0.060 inches, with tongues 28 downwardly displaced in the thickness dimension by only 0.030 inches. These dimensions, however, obviously are not critical other than to indicate that in thin sheet material the displacements of the tongue material are not very large.

As will be seen from FIG. 1C, edges 26,26a tend to be held by straps 24 into tight engagement with faces 27,27a. Thus even at the slits 22 the sheet material on both sides of the periphery of the slits closest to the bend line will be in contact with each other over the length of the slits. This tends to allow the bent sheet to be used in applications, for example, where electromagnetic shielding is required or even in applications where fluids need to be contained. It is preferred, however, in order to further insure a fluid-tight bend that a continuous, preferably flexible, coating material be adhered or bonded to the sheet across the area of slits 22. This embodiment of the present invention can be seen in FIGS. 1D and 1E, which correspond to FIGS. 1B and 1C. A continuous layer of a flexible sealant or coating 29 can be seen to have been deposited, adhered or bonded to downwardly facing surfaces of sheet 21 across the slits. This is most preferably accomplished while sheet 21 is in a substantially flat, but sheared, condition, as shown in FIG. 1D. Upon bending to the position of FIG. 1E, the coating 29 will tend to be crushed or compressed between faces 27 and 27a and the underneath side of the sheet of material. Most protective coatings, such as epoxies and paints, will be sufficiently flexible and compressible to accommodate the compression and bending of the sheet without fracturing. Thus, coating 29 will insure that there is a continuous surface that is be fluid-tight. Obviously, it would also be possible within the scope of the present invention to simply spray a coating on the bent sheet of FIG. 1E, but for many applications applying coating 29 to the flat, but punched, stamped or roll-formed sheet is more preferred since the bend lines 23 can be at complex interior locations that would be hard to coat after bending.

In cases where full coverage of both sides of the street with a flexible sealing coating is desired, one generally applies (prior to bending) a flexible coating 29 to both sides of the sheet in the embodiment of bent D-shaped tongues 28 as shown in FIGS. 2A-2C. As can be clearly seen, the bent tongue 36 rotates with respect to the sheet about edge 38. This leaves the coating in tact and continuous on the top or upwardly facing surface of the sheet, while the coating on the under or downwardly facing surface is compressed under tab end (37) as noted in FIGS. 1D and 1E.

As will be apparent to one skilled in the art, the displacement or tongues 28 of FIGS. 1A-1D can be readily formed by punching, stamping, embossing and roll-forming processes. A set of dies can be used to punch down tongues 28 with a portion of the periphery forming the bend-controlling slit 22 in the opposed edges and faces. As shown in the drawing, the phantom line 31 is not a clearly defined shoulder, but is the point at which tongue 28 reaches the top surface of the sheet and has not been downwardly displaced. FIGS. 1A-1C show a tongue or displacement 28 which has essentially been half sheared by the punching dies so that the upper surface of the displacements 28 have been displaced downwardly to about one-half the thickness dimension of the sheet, which causes the dies on the lower half of the edge to shear away and complete faces 27 and 27a.

In FIGS. 2A-2C, the process is the same, only the punching or roll-forming device have sheared displacements or tongues 36 downwardly by the full thickness, t, of the sheet. Thus a face 37 on the periphery of displacement or tongue 36 is now displaced until the upper edge of face 37 is positioned at edge 38 on the opposite side of slit 22. This tends to produce a point-to-point contact at edge 38 with the corner of face 37 during bending, as shown in FIG. 2C. Nevertheless, the edge fulcrum 38 on the edge of face 38 again precisely controls the location of bending, together with the opposed tensioning of oblique bending straps 24 along bend line 23.

In FIGS. 3A-3C, sheet 21 has been sheared during punching so that a face 42 of displacement or tongue 41 is now down below lower surface 43 of the sheet of material. Edge 44, therefore, is not engaged with opposite face 42 and will not engage face 42 during bending, as best can be seen in FIG. 3C. Instead, control of the position of the bend relative to bend line 23 is accomplished by opposite, obliquely-extending, bending straps 24. Use of bending straps 24 to control the positioning of the bend of the sheet of material is less precise than can be achieved through edge-to-face engagement of opposite sides of the slit periphery during bending. Nevertheless, oblique bending straps 24 can produce reasonably precise bends that require low bending forces and the bending straps do not excessively twist or stress during bending. Accordingly, for applications where there is more tolerance as to the dimensional requirements of the resultant product, over-displacement of tongues 41 to the FIG. 3B position can be employed. It should be noted that sets of dies can be used to progressively shear displacement or tongue 41 to the position of 3B and then displace tongue 41 upwardly at a second die station to the position of FIG. 2B or 1B. If, for example, it is desired or necessary to be certain that the downwardly displaced tongue has been sheared completely through and yet is repositioned so that the edge will engage the opposed face upon bending, a two-station operation will be performed.

In the embodiment of FIGS. 4A-4D, a fully sheared displacement or tongue 51 is shown which corresponds to the full shear of the tongue of FIGS. 2A-2C. Tongue 51, however, is formed in FIGS. 4A-4D with a downwardly deformed central reinforcing portion 52. This provides for engagement between lower edge 26 with face 27 at a corner or point located on bend line 23. Even further downwardly displaced central portion 52 of tongue 51 insures that over bending the sheet will be limited.

Turning now to FIGS. 5A-5D, a displacement of the sheet material to provide an edge and opposed face by plastic deformation, rather than shearing, is shown. Sheet 21 has been downwardly displaced at 61 typically by stamping or roll-forming dies that are not provided with sharp edges so that the downward displacement has resulted in a plastic deformation of area 62 of the sheet. Upon bending, the bending strips 24 will again be tensioned or bent and thereby pull the sheet on opposite sides of the bend line 23 together so that area 62 deforms without shearing or fracturing. In effect, a virtual face on the end of displacement 61 engages a virtual edge 63 on bend line 23 so as to precisely control the location of the bend. This approach is best suited to ductile sheet material and it has the advantage of resulting in a fluid-tight bend.

In FIG. 5D an alternative is shown in which fracturing or rupturing occurs at face 64 so that the virtual face becomes an actual face 64. In terms of precision bending, it does not matter whether or not fracture 64 occurs and edge 63 is bending off of an actual face 64 or a virtual face at the end of downward displacement of tongue 61.

In FIGS. 6A-6C and 7A-7C, the displacements have a closed periphery or are formed as slugs of material that are downwardly displaced on alternative sides of bend line 23. It will be understood that for ease of illustration a plurality of these slug-type displacements have not been shown, but they would be positioned as shown in FIG. 1A, preferably with the peripheral side closest to the bend line positioned in superimposed relation to bend line 23. Such oval-shaped displacements or slugs are readily amenable to punching, stamping, roll-forming and similar high production, low-cost fabrication processes. The slug may take various shapes including 'D' shape and non-uniform shapes that produce diagonal straps and edge-to-face engagement.

In FIG. 6A, sheet 22 has been formed with an oval-shaped displacement 71 having a portion of its periphery 22 closest to bend line 23 downwardly displaced as shown in FIGS. 6B and 6C. The downward displacement or shearing of displacement 71 produces a face 27 against which lower edge 26 across periphery 22 bears. As the sheet is bent, face 27 pivots about face 26 to the position shown in FIG. 6C and oblique straps 24 between the ends of longitudinally adjacent oval displacements 71 are bent as described above for straps 24 between tongues 28. Since this a half shear of displacement 71, the result is essentially the same as that achieved in FIGS. 1A-1C except there is a remote side 72 of the periphery of displacement 71 that also is sheared. As can be seen from FIG. 6B, remote side 72 is in the oval bore punched into the sheet so as to support face 27 during pivoting of edge 26 for precise location of bend on bend line 23.

FIGS. 7A-7C are similar to FIGS. 6A-6C only the portion of periphery of the oval displacement or slug 81 on bend line 23, namely, the bend controlling slit 22, has been sheared by the full thickness of the sheet, while remote peripheral side 82 has only been half sheared. Edge 26, therefore, pivots on the upper corner of face 27 in a manner similar to that shown in FIGS. 2A-2C.

Although not shown, oval displacements or slugs 71 and 81 also can be completely punched or stamped out of sheet 21 to leave oval holes along the sheet. Such holes will define obliquely extending bending straps 24 skewed in opposite directions at opposite ends of each of the holes. These bending straps extend across the bending line 23 and will again produce bending along bending line 23, but without edge-to-face engagement because the slug faces 27 are now gone. While providing less precision, such an embodiment will produce reasonably accurate bending along bending line 23.

In FIGS. 8-11, two alternative embodiments of the punched or stamped sheets of the present invention are shown in which "shin guards" have been added to the corners of the bent sheets. In prior related U.S. patent application Ser. No. 10/672,766, the use of corner coverings over the bend lines so as to present a smooth corner surface was described. Such coverings are referred to herein and in prior related applications as "shin guards," and FIGS. 8-11 illustrate two embodiments of the manner in which shin guards can be secured to the corners of bent sheets.

In FIG. 8, a sheet of material 21 has been bent at a right angle. Sheet 21 has a plurality of tongue displacements 28 constructed as shown in connection with FIGS. 2A-2C. The upper corner of faces 27 of such displacements are in edge-to-face engagement with the edge 26 on the other side of the periphery of tongue displacement 28. Punched into sheet 21 are a plurality of outwardly extending securement tabs 91 which are used to couple shin guard 92 around the corner of the bent structure and across bend line 23. In the embodiment shown in FIGS. 8 and 9, shin guard 92 includes a cavity 94 dimensioned to receive tab 91, and the cavity preferably has a tapered entrance surface 96 which leads to an outwardly facing shoulder 97 that engages with inwardly facing shoulder 98 on the tabs 91. The shin guard, therefore, can simply be positioned over the tabs 91 and then urged toward the bent sheet 21 to cause shoulders 97 to snap in behind inwardly facing surfaces 98 of the tabs and thereby secure the shin guard to the corner of the bent structure. Alternatively, the shin guard may be slid in place along the corner.

In FIGS. 10 and 11, openings 101 are periodically provided in sheet material 21 and a shin guard 103 is provided having tapered and necked protrusions 104. Protrusions 104 are urged through openings 101 so that an outwardly facing inwardly shoulder 106 snaps in behind inwardly facing surface 107 of the bent sheet 21. Again, the displacements or tongues 28 are constructed as shown in connection with FIGS. 2A-2C.

One of the important features of the slit or displacement geometries described in this application, and the prior related applications, is that folding of the sheet of material requires relatively small forces. Bending straps 24 preferably comprise less than a majority of the material along the bend line and they are twisted and bent during bending of the sheet material. The fulcrum between edge 26 and face 27 and the long lever arm of the sheet on both sides of the bend line, makes bending of the sheet with relatively low force very simple. It is possible, for example, to place an edge of the sheet in a slot or groove and then manually apply a force to the opposite edge to easily bend the sheet. In most cases where the sheet material would be bent for an electronic chassis, the sheet can be bent by hand. It is most preferred, however, to be able to perform the bending in an automatic machine-implemented process, for example, in a progressive die assembly in which the sheet is prepared for bending at a first station by forming displacements along the bend line, and the sheet is thereafter moved to another station and then bent by relatively low-force bending apparatus.

FIGS. 12A-C show a mechanical bending apparatus in which a fixed tool plate 110 supports a sheet 21, which has been prepared for bending in the manner described above. A bending cylinder 111 is mounted to a movable linkage or arm 112 for downward displacement, as shown by arrow 113. As cylinder 111 is brought down against sheet 21, an edge 114 of a notch 116 in the cylinder engages sheet 21 and begins to rotate the cylinder and linkage 112 in a clockwise direction. As the linkage 112 continues to move downwardly, cylinder 111 continues to rotate to the position 21 so as to form shown in FIG. 12C. Alternatively, the tool plate 110 can be movable or both tool plate 110 and cylinder 111 can be movable.

An alternative approach shown in FIGS. 13A and 13B is for tool plate 110 to have a pneumatic bladder 121 positioned over edge 122 of the tool plate. As bladder 121 is inflated to the condition shown in FIG. 13B, it engages the unsupported portion of sheet 21 and drives it down to the bent position shown in FIG. 13B. The low bending force required to effect the bend of FIG. 13B will easily permit the use of pneumatic bending systems.

Other bending equipment suitable for use for bending the sheets of the present invention would include a press brake.

In FIGS. 14A-14D and 15A-15D, the use of machining, chemical milling or photo etching of grooves into the sheet using geometries of the prior related applications is described. In FIG. 14A, a sheet 221 is formed with a plurality of grooves 222 along a bend line 223 as above taught in connection with displacements or shear lines 22. In the preferred form, an edge 226 of grooves 222 falls on or is substantially superimposed relative to the plane of bend line 223. Grooves 222 alternate on opposite sides of bend line 223 and between longitudinally adjacent grooves 222 are bending straps 224, which will be seen to extend obliquely across bend line 223.

In FIG. 14C, sheet 221 has been bent out of the page in FIG. 14C or toward grooves 222. The result will not be edge-to-face engagement of actual fulcrums to produce precise bending, but instead the bending will be caused by the equal tension on oblique bending straps 224, which will produce bending substantially along bend line 223. The precision of bending toward the grooves will not be quite as good as can be achieved with edge-to-face bending, but the precision is quite acceptable for many applications, for example, in connection with electronic chassis components.

In this regard, it should be noted that the embodiments of the present invention shown in FIGS. 1A-7C are all shown as having been bent in the direction of the displacement of the tongues or slugs formed in the sheet during preparation of the sheet for bending. Those same embodiments, however, could also be bent in an upward direction, that is, against the direction of displacement of the tongues or slugs during slitting of the sheets. Such reverse bending will cause the bending straps 24 to control the precision of the bend, rather than edge-to-face engagement, but the straps will give a reasonably precise bend along the bend line 23.

Sheet 221 of FIGS. 15A-15D has been prepared for bending by grooving, with the grooves having stress relieving lands or areas 228 at each end. Again, the grooves 222a do not go through the complete thickness of the sheet and they define bending straps 224a that are oblique to bending line 223a. Again, the sheet has been bent into the grooves, rather than away from them, and straps 224a are used to control the position of the bend along bend line 223a.

Turning now to FIGS. 16A-16F, an embodiment of the present invention is shown in which the material between longitudinally adjacent arcuate slits on the same side of the bend line is displaced, rather than the tongues or slugs defined by the slits. In FIG. 16A a sheet of material 321 is shown having a plurality of slits 322 positioned on alternating sides of bend line 323. Obliquely extending bending straps 324 are provided, and slits 322 define tongues 328 and intermediate areas 330 on each side of the arcuate slit 322.

Unlike the embodiments previously described, however, D-shaped tongues 328 are not displaced but remain in the plane of sheet 321. Instead, the material or area 330 longitudinally adjacent to or between tongues 328 on the same side of bend line 323 is upwardly displaced, as best may be seen in FIG. 16E. Thus, during the punching, roll-forming, embossing, stamping or the like, the shear which produces slits 322 and faces 327 is an upward shear in which area 330 is upwardly displaced from the plane of sheet 321. The lower corner or edge 326 of upwardly displaced area 330 bears on the corner of face 327. As the sheet is bent to the position of FIG. 16F, edge 326 will slide down face 327 and bend bending strap 324 precisely about rotated bend line or plane 323. The resultant bent sheet is also shown in FIGS. 16C and D, although they are rotated by 90 degrees relative to FIG. 16F.

As was above described in connection with the other embodiments, the embodiment of FIGS. 16A-16F employs a displacement process in which the sheared slits 322 have geometries according to the prior related applications. Preparation of sheets for low-force precise bending can be accomplished using low-cost fabrication techniques such as punching, stamping, roll-forming and the like.

In one embodiment shown in FIG. 17, displacements 420 are formed in a sheet of material 421 in a manner similar to the slits, tongues, and displacements discussed above. In this embodiment, the displacements include a modified tongue 428 which includes a flat zone 431 and a transition zone 432. The flat zone is substantially parallel to the overall plane of sheet 421, while the transition zone extends at an angle and interconnects the flat zone with the remainder of the sheet, as most clearly seen in FIG. 18A.

In the preferred form, displacements 420 are formed by displacement in the direction of the thickness of material so that a portion of the periphery of the displacement closest to bend line 423 provides an edge 426. The displacement process also forms a corresponding opposed face 427 configured and positioned to produce edge-to-face engagement of with the edge during bending. As shown in FIG. 17, displacement 420 includes an elongated tongue 428 having substantially semicircular ends. In the illustrated embodiment, the ends of tongue 428 are substantially semicircular, however, one will appreciate that the actual geometry of the ends may vary. For example, curves having multiple radii may be used, and oval, elliptical, parabolic and/or other suitable curved shapes may also be used.

Figure 18A:
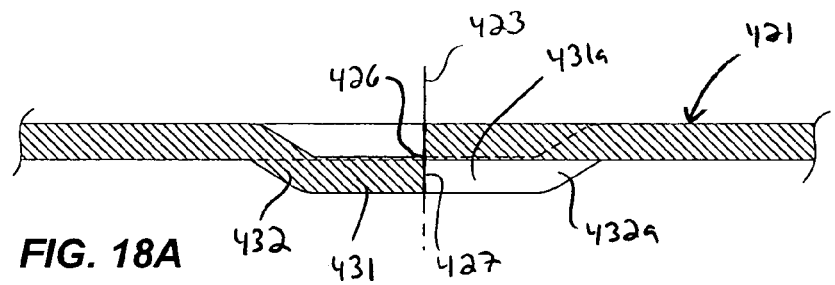
FIG. 18A and FIG. 18B are enlarged, fragmentary, end elevation views, in cross-section of the sheet of FIG. 17, taken substantially along line 18-18 in FIG. 17, FIG. 18B illustrating further, optional working of the sheet of FIG. 17.

As shown in FIG. 18A, elongated tongue has been downwardly displaced to provide a face 427 against which a lower corner or edge 426 of tongue 428 will engage when sheet 421 is bent along bend line 423. As illustrated best in FIG. 17 and FIG. 18A, a portion of the slit periphery is superimposed on the plane of bend line 423. One will appreciate, however, that the portion of the slit periphery may be located a suitable jog distance from the bend line, as is discussed below.

The next slit, which is into the page in FIG. 18A, has a similar elongated tongue 428a which has been downwardly displaced to provide a face 427a against which an edge 426a will engage.

Preferably, the tongue is displaced downwardly a distance that is approximately 60-100% of the thickness of the sheet, and most preferably approximately 80% the thickness of the sheet. Such configuration will provide a point of engagement between edge 426, 426a and face 427, 427a, respectively, that is below the midpoint of the face, and preferably, positioned at a point that is approximately 60-100% of the sheet material thickness away from the outside surface of sheet 421 (e.g., approximately 60-100% of the sheet material thickness away from the top surface of sheet 421 as shown in FIG. 18A), and most preferably, approximately 80% of the sheet material thickness away from the outside surface of sheet 421. One will appreciate that the outside surface of the sheet refers to the surface of sheet 421 that is adjacent the bend line forming the external corner as opposed to the surface forming the internal corner.

When sheet 421 is bent, for example, by 90 degrees, edges 426, 426a pivot around and engage faces 427, 427a below midpoint in the faces. One will appreciate, however, that the point of engagement may be at or below the midpoint of the face, preferably at a point that is spaced approximately 60-100% away from the outside surface of the sheet, and more preferably at about 80% from the outside surface. As bending continues, the point of engagement of each displacement act as opposed fulcrums which are positioned on bend line 423. Thus, almost immediately as the bend begins, the edges 426, 426a are rotated into engagement with faces 427, 427a, with result that bending is very precisely controlled to occur about bend line 423. The bending straps 424 pull and maintain edges 426, 426a against faces 427, 427a during bending to maintain the fulcrums in contact with the opposed faces.

Figure 18B:
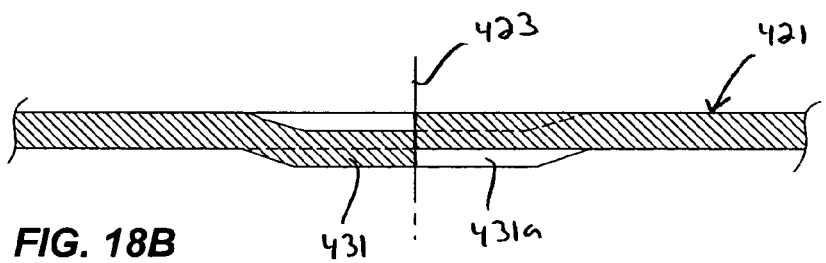

One will also appreciate that the elongated tongues may be further worked to modify their final position with respect to the sheet. For example, the elongated tongues may be "flatten backed" in which case the tongues are, following displacement, hit with a flat punch tool to push the tongues partially or fully back into the cavity created during displacement, as shown in FIG. 18B. Flatten back can either be local to have flanges sit flush over one or more faces, or along the entire bend line allowing the sheet material to fold back upon itself to create a hemmed sheet edge or boarder.

Figure 19:
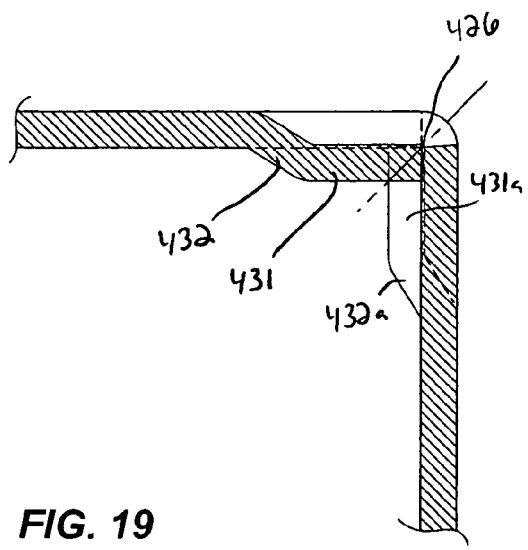
FIG. 19 is an enlarged, fragmentary, end elevation view, in cross-section of the sheet of FIG. 18A subsequent to folding.

As was the case above, the illustrations in FIGS. 18 and 19 are greatly enlarged in thickness to enable the edge-to-face contact to be more clearly illustrated. It will be understood, however, that sheet 421 can be relatively thin, for example, 0.060 inches, in which case tongues 428 may be downwardly displaced in the thickness dimension preferably in the range of approximately 0.030 to 0.070 inches.

As will be seen from FIG. 19, edges 426, 426a tend to be held by straps 424 into tight engagement with faces 427, 427a. Thus even at the displacements 420 the sheet material on both sides of the periphery of the slits closest to the bend line will be in contact with each other over the length of the displacements. Such contact promotes fold symmetry as the engagement of edges 426,426a with faces 427, 427a is substantially uniform along the length of the bend line.

The configuration of elongated displacements accommodates a wider range of strap widths W and jog distances, that is, the distance between slits as discussed above. For example, the configuration of elongated displacements may be used with strap widths that are approximately 2-5 times the thickness t of the sheet, and with approximately −10% to 10% jog and produce a very consistent fold quantity. Such configuration allows greater latitude in geometries used in populating a bend line with displacements thereby more readily accommodating for various length sheets and more readily accommodating for "obstacles" which may lay on or adjacent the bend line. For example, if the sheet of material has a recess or an aperture located along the bend line, the spacing between adjacent displacements and/or the jog distance of the displacements may be more readily varied to accommodate for such obstacles.

The configuration of elongated displacements also reduces the amount of strap twisting about the axis of the strap and promotes bending of the strap about the bend line. As strap twist is reduced, the strap width is less critical whereby straps of varying width may be used along the same fold line, as will be discussed in greater detail with respect to FIG. 24 below.

In promoting pure bending and minimizing strap twist, the configuration of the elongated displacements may facilitate lower bending forces required to initiate and complete folding along the bend line. As engagement of edges 426, 426a with faces 427, 427a commences upon the onset of folding, and because strap twist is limited, the overall amount of plastic deformation and material strains generated during the folding process may be reduced thereby reducing bending forces. For example, the folding of sheet 421 illustrated in FIGS. 18 and 19 generates less material strain and plastic deformation due to the minimal strap twist that occurs.

Furthermore, the elongated-displacement configuration of sheet 421, and the reduced plastic deformation and material strain generated during bending, promotes coating adhesion. As noted above, a flexible sealant or coating (see, e.g., FIGS. 1D and 1E) can be applied to the sheet while the sheet is in a substantially flat, but sheared, condition, as shown in FIG. 18A. Upon bending to the position of FIG. 19, the amount of crush or compression the coating undergoes during bending will be reduced commensurate to the reduction of plastic deformation and material strain and thus will adhere better during folding. Thus, sheet 421 may be painted in the flat state (see, e.g., FIG. 18A) and folded (see, e.g., FIG. 19) without loosing paint quality. Furthermore, as no new surfaces are generated during folding, that is, no surfaces that were not already exposed prior to bending, there are not unpainted surfaces that will appear once the material is folded.

Figure 20A:
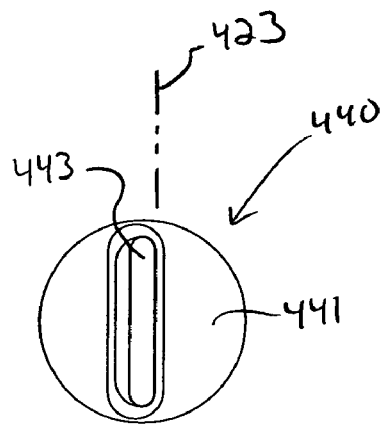
FIGS. 20A, 20B and 20C are schematic views of tooling which may be used to form bend controlling displacements in the sheet of FIG. 17 in accordance with the present invention.
Figure 20B:
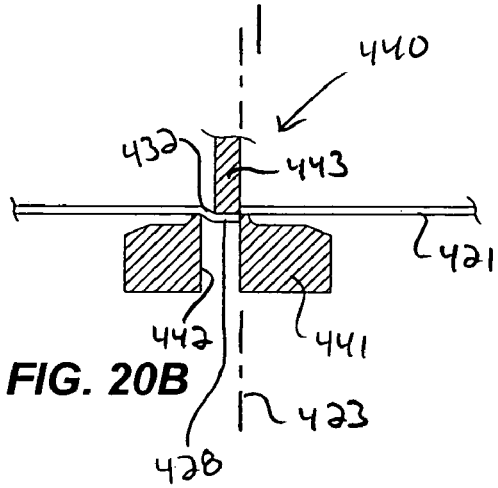
Figure 20C:
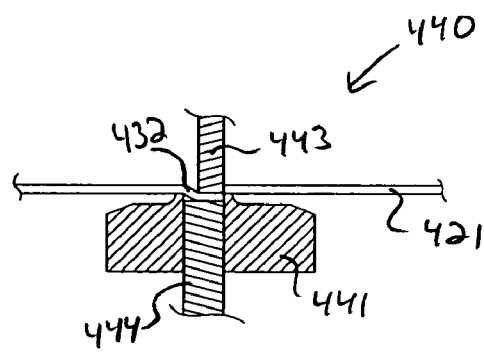

Elongated displacements 420 can be readily formed by punching, stamping, embossing, roll-forming processes, and the like. The configuration of elongated displacements 420 are also well suited for fabrication by means of turret punching, as schematically shown in FIGS. 20A-20C. As shown in FIG. 20B, a turret punch assembly 440 includes a die body 441 having a recess 442, a die punch 443, and a die ejector 444 which may be configured to move as a unit in a conventional manner. In particular, the turret punch assembly may be positioned with respect to sheet 421 such that die body 441 is positioned beneath, and die punch 443 is positioned above, sheet 421 at the desired position of elongated displacement 420. Once die body 441 is positioned against the bottom surface of sheet 421, die punch 443 impacts against the top surface of sheet 421 causing the tongue to displace downwardly into recess 442. One will appreciate that the die body need not necessarily include a recess. The die body can have a positive form in which case the displacements can be punched up.

The configuration and dimensions of die punch 443 generally conform to the desired shape of flat zone 431, while the configuration and dimensions of die body 441 and recess 442 generally conform with the desired shape of the transition zone 432. The tight tolerance between the right side of die punch 443 and die body 441 cause tongue 428 to shear along bend line 423, while the increased tolerance between the left side of die punch 443 allows for non-shearing displacement of transition zone 432. Optionally, a die ejector 444 may be used to eject tongue 428 from die body 442. One will appreciate that a die ejector may only be necessary in certain cases, for example, in the case of thinner sheet materials. Once elongated displacement 420 is formed, turret punch assembly 440 may be repositioned with respect to sheet 421 and the process repeated to form elongated displacement 421a, and/or subsequent elongated displacements. Alternatively, sheet 421 may be repositioned relative to the turret punch assembly, as necessary, to form the various elongated displacements.

One will appreciate that the position of the turret punch assembly with respect to the sheet may be controlled by conventional means. For example, computer numeric control (CNC) may be used to control the location of one or more turret punch assemblies. In particular a single turret punch assembly can form a first elongated displacement (e.g., 420), be repositioned with respect to sheet 421, and rotated 180°, and form a second elongated displacement (e.g., 420*a*), and so on.

Figure 21A:
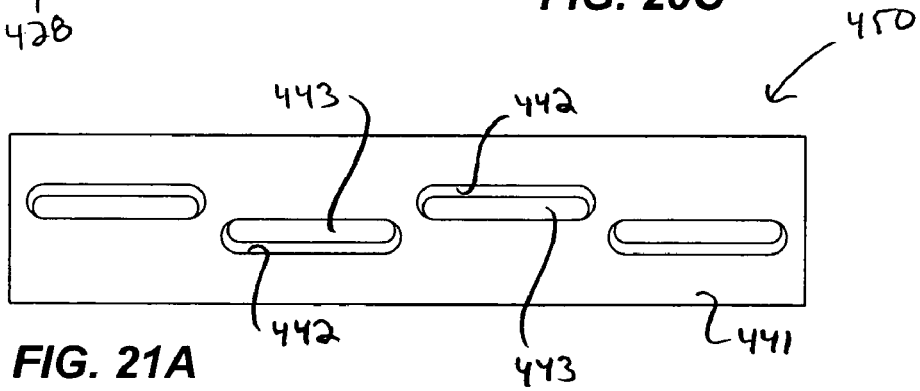
FIG. 21A and FIG. 21B are schematic top plan views of other tooling that may be used to form the bend controlling displacements in the sheet of FIG. 17.

In another embodiment shown in FIG. 21A, a die set 450 having a predetermined configuration of elongate-displacement-forming surfaces may be provided which stamps or punches a number of elongated displacements (e.g., 420, 420*a*, etc.) simultaneously. Die set 450 may include a die body 451 having a plurality of recesses 452 that correspond with complementary set of die punches 453 which move in unison in order to form several elongated-displacements simultaneously.

Figure 21B:
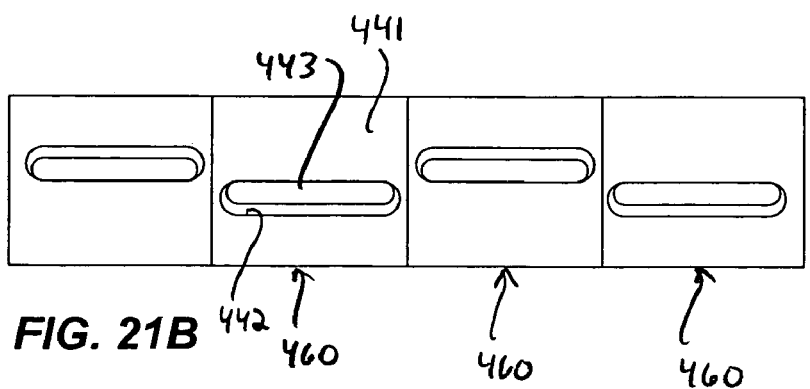

FIG. 21B illustrates another die set similar to that shown in FIG. 21A, except that die set is formed of a plurality of modular die units 460, each unit corresponding in size and shape to a desired elongated displacement. One, two, three or more die units may be used to form a corresponding number of elongated displacements. The modular units may be interconnected to one another by any suitable means. In some aspects, the modular units resemble conventional typesetting that a plurality of die units may be configured to form any desired number of elongated displacements 420, 420*a*, etc.

Figure 22A:
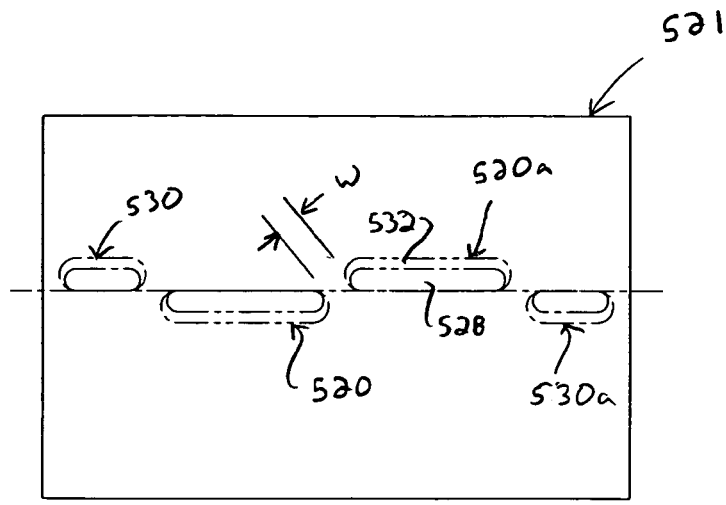
FIG. 22A and FIG. 22B are fragmentary, schematic top plan views similar to FIG. 17 of another sheet of material having bend controlling displacements formed therein.
Figure 22B:
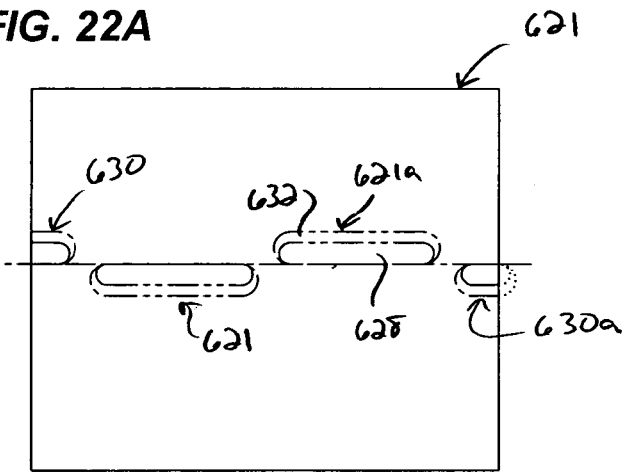

Turning now to FIGS. 22A and 22B, the configuration of elongated displacements required for a particular sheet of material may vary depending upon the geometry and configuration of the sheet of material. As one will appreciate, there are certain advantages in "standardizing" the size of elongated displacements in order to reduce tooling costs and otherwise simplify the design process. For example, the elongated-displacements may be standardized in one, two, three or more "standard" sizes for sheet materials of a particular thickness, particular type of material and/or other parameters.

As shown in FIG. 22A, elongated displacements 520, 520*a* of a first length (e.g., having a length of approximately 1.4 inches) are used in combination with elongated displacements 530 of a second shorter length (e.g., approximately 0.7 inches). The use of different-length elongated displacements allows a designer to ensure that the strap widths fall within a preferred range (e.g., approximately 2-5 times the thickness t of sheet 520).

In the embodiment of FIG. 22A, there is no terminal stamp or displacement, that is, no displacement extending to the edge of sheet 521. Such a no-terminal-stamp configuration is advantageous in that one need not worry about providing clearances to stamp neighboring sheets and the need for a short smile configuration for terminal straps.

As noted above, the configuration of the elongated displacements of the present invention allows a wider range of strap lengths to be used. In this embodiment, the number and size of elongated displacements has been selected such that the strap widths between elongated displacements 530, 520, 520*a* and 530*a* all remain within the preferred range of approximately 2-5 times the thickness of the material. In contrast, sheet 621 of FIG. 22B includes terminal stamps or displacements 630 and 630 which extend to the terminal edge of the sheet. Again, however, the size and number of elongated displacements have been selected such that the strap widths between elongated displacements 630, 620, 620*a* and 630*a* remain within the preferred range of strap widths.

In order to form the elongated displacements of different lengths, die sets of corresponding lengths may be provided.

Figure 23A:
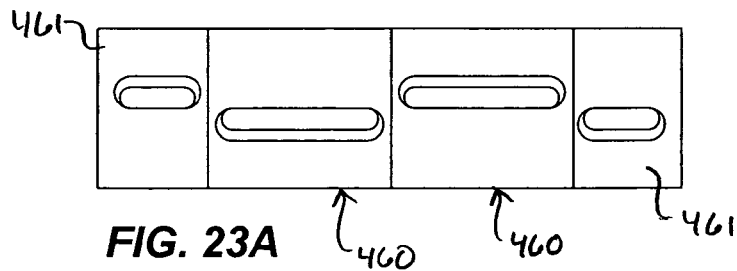
FIG. 23A and FIG. 23B are schematic top plan views of tooling that may be used to form the bend controlling displacements in the sheet of FIG. 22A and FIG. 22B, respectively.
Figure 23B:
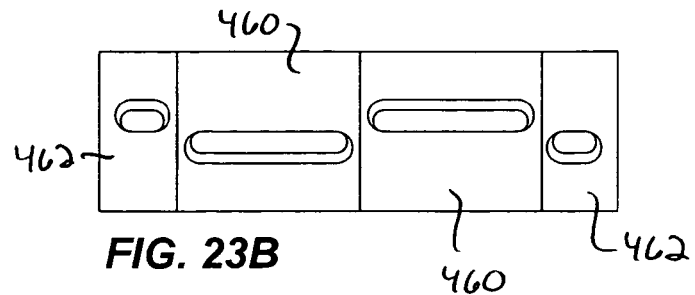

For example, in the case of the modular die sets, long die units 460 may be used in combination with medium die units 461, as shown in FIG. 23A, to form the elongated displacement configuration of sheet 521 shown in FIG. 22A. Similarly, long die units 460 may be used in combination with short die units 462, as shown in FIG. 23B, to form the configuration of sheet 621 shown in FIG. 22B.

Figure 24:
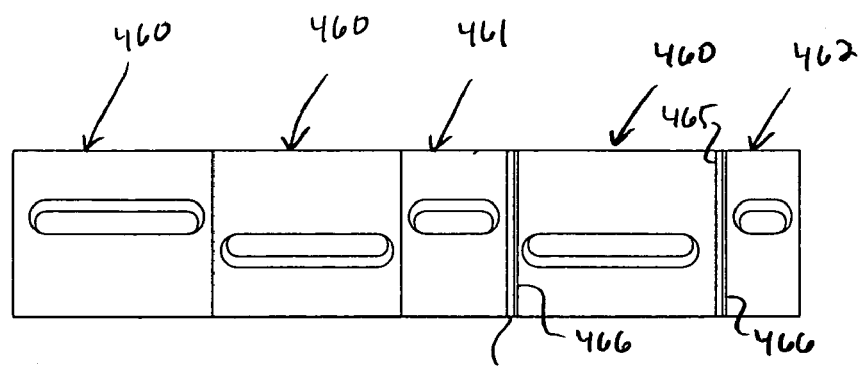
FIG. 24 is a schematic top plan view of tooling similar to that shown in FIG. 23A and FIG. 23B.
Figure 25A:
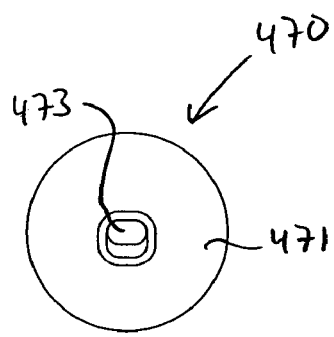
FIG. 25A, FIG. 25B, and FIG. 26C are schematic views of tooling which may be used to form bend relatively short controlling displacements in accordance with the present invention.
Figure 25B:
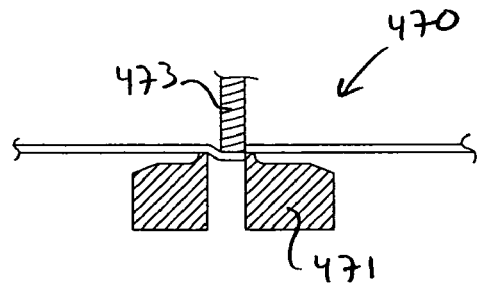
Figure 26C:
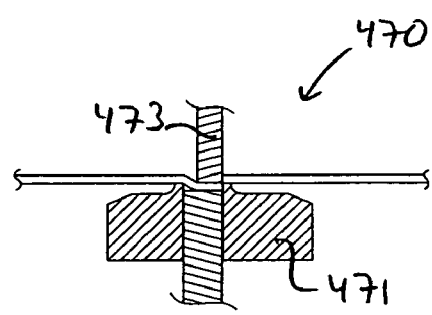

Further still, one will appreciate that various combinations of long, medium and short die unites may be used in order to provide a wider variety of elongated displacement configurations. For example and as shown in FIG. 24, long die units 460 are used in combination with medium and short die units 461, 462. In this embodiment, shims 465, 466 of varying widths are also used in order to provide further adjustment of strap widths along the bend line. One will further appreciate that the standardized sizing of the elongated displacements may also be used in conjunction with turret punch press assemblies. For example, turret punch press assembly 470, having a die body 471 and a die punch 473 as shown in FIGS. 25A-C is dimensioned and configured to form short elongated displacements.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of preparing a sheet of material for bending along a bend line comprising the steps of:

defining a bend line in a planar sheet of material, and forming at least two displacements in the thickness direction of the sheet of material out of the plane of the sheet of material and spaced along the bend line, the displacements each including a flat zone substantially parallel to the plane of the sheet of material with a portion of the periphery of the displaced flat zones including edges extending along and adjacent to the bend line, and including angled transition zones interconnecting the flat zones with the remainder of the sheet of material, the edges being configured and oriented relative to the remainder of the sheet of material to provide a fulcrum for bending along the bend line and contacting a remainder of the planar sheet during bending.

2. The method as defined in claim 1 wherein, the forming step providing the portion of the peripheiy adjacent the bend line with an edge and the sheet of material with a corresponding opposed face configured and positioned to produce edge-to-face engagement of the sheet of material during bending.

3. The method as defined in claim 2 wherein.

the forming step shears the sheet of material entirely through the thickness dimension along the portion of the periphery.

4. The method as defined in claim 1 wherein, the forming step is accomplished using one of a stamping process, a punching process, a roll forming process, a shearing knife-based and an embossing process.

5. The method as defined in claim 1 wherein,
during the forming step, forming a plurality of displacements in the sheet of material along the bend line with each displacement having a flat zone having a periphery portion proximate the bend line to provide a plurality of edges and opposed faces for edge-to-face bending of the sheet of material.

6. The method as defined in claim 5 wherein,
during the forming step, forming the plurality of displacements along the bend line with each flat zone having the periphery portion substantially superimposed on the bend line.

7. The method as defined in claim 6 wherein,
the forming step is accomplished using one of a stamping process, a punching process, a roll forming process, a shearing knife-based and an embossing process.

8. The method as defined in claim 7 wherein,
the forming step is accomplished using a turret press to form each of the plurality of displacements, wherein the turret press is relocated with respect to the sheet of material to the desired location of each of the plurality of displacements.

9. The method as defined in claim 7 wherein,
the forming step is accomplished using a modular die set including a number of die units corresponding in number to the number of displacements.

10. The method as defined in claim 9 wherein,
the plurality of displacements are differently sized, wherein the die units are similarly differently sized and complementary in number and size to the plurality of displacements.

11. The method as defined in claim 6 wherein,
during the forming step, positioning the periphery portion of displacements on opposite side of the bend line at a jog distance from each other loss than the thickness dimension of the sheet of material.

12. The method as defined in claim 11 wherein,
the jog distance is in the range of about −0.5 to about +0.5 times the thickness dimension of the sheet of material.

13. The method as defined in claim 12 wherein,
during the forming step, forming the peripheral portions of displacements on opposite sides of the bend line to define bending straps oriented to extend obliquely across the bend line.

14. The method as in claim 13 wherein,
the bending straps have a strap width that is approximately 2-5 times the thickness of the material.

15. The method as defined in claim 1, and the step of:
after the forming step, adhering a layer of coating material to the sheet of material across the portion of the periphery of the displacement.

16. The method as defined in claim 15 wherein,
the adhering step forms a continuous layer of flexible coating material.

17. The method as defined in claim 1 wherein,
the flat zone is elongated and includes curved ends.

18. The method as defined in claim 17 wherein,
the periphery of the curved ends is formed semicircular in shape.

19. The method as denied in claim 1 further comprising:
bending the sheet of material along ate bend line.

20. The method as defined in claim 19 wherein,
the bending step is accomplished manually.

21. The method as defined in claim 1 further comprising:
further working the displacement to flatten the displacement back into a cavity formed during the forming step.

22. The method as defined in claim 1 wherein,
the Forming step providing the portion of the periphery adjacent the bend line with a virtual edge and the sheet of material with a corresponding opposed virtual face configured and positioned to control the location of bending of the sheet of material during bending.

23. A sheet of material suitable for bending along a bend line formed by the method of claim 1.

24. The sheet of material as defined in claim 23 wherein,
the portion of the periphery adjacent the bend line includes an edge and the sheet of material includes a corresponding opposed face configured and positioned to produce edge-to-face engagement of the sheet of material on oppositeness of the portion of the periphery during bending.

25. The sheet of material as defined in claim 24 wherein,
alternating displacements are positioned longitudinally along and on opposite sides of the bend line to define bending straps between adjacent ends of displacements extending across the bend line.

26. The sheet of material as defined in claim 25 wherein,
the lateral jog distance between the portion of the periphery on opposite sides of the bend line is less than the thickness dimension of the sheet material.

27. The sheet of material as defined in claim 26 wherein.
the lateral jog distance is in the range of about −0.5 to about +0.5 times the thickness dimension of the sheet of material.

28. The sheet of material as defined in claim 27 wherein,
the lateral jog distance is about zero and the portions of the periphery are substantially superimposed on the bend line.

29. The sheet of material as defined in claim 23 wherein,
the portion of the periphery of die displacement is sheared completely through the thickness dimension of the sheet of material.

30. The sheet of material as defined in claim 23 wherein,
the sheet of material is bent along the bend line.

31. The sheet of material as defined in claim 30 wherein,
the sheet of material is bent in a direction opposed to the direction of the displacement.

32. The sheet of material as defined in claim 23, and
a continuous layer of coating material adhered to at least one surface on tie sheet of material after the displacement is formed.

33. The sheet of material as defined in claim 32 wherein,
the sheet of material is bent along the bend line without fracturing the continuous layer of coating material.

* * * * *

UNITED STATES PATENT AND TRADEMARK OFFICE
CERTIFICATE OF CORRECTION

| | |
|---|---|
| PATENT NO. | : 7,350,390 B2 |
| APPLICATION NO. | : 11/080288 |
| DATED | : April 1, 2008 |
| INVENTOR(S) | : Max W. Durney et al. |

Page 1 of 1

It is certified that error appears in the above-identified patent and that said Letters Patent is hereby corrected as shown below:

In claim 2, col. 18, line 55, change "peripheiy" to --periphery--.

Signed and Sealed this

Sixteenth Day of June, 2009

JOHN DOLL
*Acting Director of the United States Patent and Trademark Office*